United States Patent
Shioya et al.

(10) Patent No.: US 6,642,157 B2
(45) Date of Patent: Nov. 4, 2003

(54) FILM FORMING METHOD AND SEMICONDUCTOR DEVICE

(75) Inventors: Yoshimi Shioya, Tokyo (JP); Yuichiro Kotake, Tokyo (JP); Youichi Yamamoto, Tokyo (JP); Tomomi Suzuki, Tokyo (JP); Hiroshi Ikakura, Tokyo (JP); Shoji Ohgawara, Tokyo (JP); Kouichi Ohira, Tokyo (JP); Kazuo Maeda, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 09/742,242

(22) Filed: Dec. 22, 2000

(65) Prior Publication Data

US 2001/0034140 A1 Oct. 25, 2001

(30) Foreign Application Priority Data

Dec. 28, 1999 (JP) .......................... 11-375611
Jun. 22, 2000 (JP) .......................... 2000-188307
Aug. 31, 2000 (JP) .......................... 2000-263991

(51) Int. Cl.[7] .................. H01L 21/31; H01L 21/469
(52) U.S. Cl. ............................... 438/789; 438/788
(58) Field of Search ............................ 438/787, 788, 438/789

(56) References Cited

U.S. PATENT DOCUMENTS

| | | | |
|---|---|---|---|
| 5,521,126 A | * | 5/1996 | Okamura et al. ............ 437/235 |
| 5,605,867 A | | 2/1997 | Sato et al. ............ 437/235 |
| 5,656,337 A | | 8/1997 | Park et al. ............ 427/539 |
| 5,989,998 A | | 11/1999 | Sugahara et al. ............ 438/623 |
| 2001/0023125 A1 | | 9/2001 | Nishimoto et al. ............ 438/623 |

FOREIGN PATENT DOCUMENTS

| | | | |
|---|---|---|---|
| EP | 0 299 754 | 7/1988 | |
| EP | 0 573 911 A2 | 6/1993 | |
| JP | 6-168930 | 6/1994 | |
| JP | 7-211712 | 8/1995 | |
| JP | 10-189577 | 7/1998 | ......... H01L/21/316 |
| JP | 10-284486 | 10/1998 | ......... H01L/21/316 |
| JP | 11-288931 | 10/1999 | |
| KR | 1998-019144 | 6/1998 | ........... H01L/21/31 |
| KR | 1998-063389 | 10/1998 | ......... H01L/21/314 |
| WO | 99/41423 | 2/1999 | |

OTHER PUBLICATIONS

Hegemann et al., Deposition of SiOx films from O2/HMDSO plasmas, 6th International Conference on Plasma Surface Engineering, Germany Sept. 14–18,1998, vol. 116–119, pp. 1033–1036.

* cited by examiner

Primary Examiner—Alexander Ghyka
(74) Attorney, Agent, or Firm—Lorusso, Loud & Kelly

(57) ABSTRACT

There is provided the film forming method of forming the insulating film 204 containing silicon on the substrate 103 by plasmanizing the compound having the siloxane bonds and the oxidizing gas to react with each other.

20 Claims, 22 Drawing Sheets

HMDS flow rate : 50sccm
N2O flow rate : 200sccm
substrate temperature : 350°C
electrode distance : 25mm
power of the first high-frequency power supply 107 :
300W
power of the second high-frequency power supply 109 :
0W HMDS flow rate : 50sccm
N₂O flow rate : 200sccm
substrate temperature : 350°C
electrode distance : 25mm
power of the first high-frequency power supply 107 :
300W
power of the second high-frequency power supply 109 :
30W HMDS flow rate : 50sccm
N₂O flow rate : 200sccm
substrate temperature : 350°C
electrode distance : 25mm
power of the first high-frequency power supply 107 :
100W HMDS flow rate : 50sccm
N2O flow rate : 200sccm
substrate temperature : 350°C
electrode distance : 50mm
pressure : 0.9Torr
power of the second high-frequency power supply 109 :
　　　　　　　　　　　　　　　　　　　　　　　　0W HMDS flow rate : 50sccm
N2O flow rate : 200sccm
substrate temperature : 350°C
electrode distance : 50mm
pressure : 0.9Torr
power of the first high-frequency power supply 107 :
300W HMDS flow rate : 50sccm
H2O flow rate : 100sccm
substrate temperature : 200°C
electrode distance : 25mm
power of the first high-frequency power supply 107 :
　　　　　　　　　　　　　　　　　　　　　　　　0W
power of the second high-frequency power supply 109 :
　　　　　　　　　　　　　　　　　　　　　　　　100W HMDS flow rate : 50sccm
H2O flow rate : 250sccm
substrate temperature : 375°C
electrode distance : 25mm
pressure : 2.3Torr
power of the first high-frequency power supply 107 :
300W

| power (W) of the second high-frequency power supply 109 | deposited film thickness (nm) |
|---|---|
| 0 | 327.1 |
| 30 | 422.2 |
| 50 | 473.7 |
| 75 | 483.0 |
| 100 | 479.4 |

HMDS flow rate : 50sccm
H2O flow rate : 250sccm
substrate temperature : 375°C
electrode distance : 25mm
pressure : 2.3Torr
power of the first high-frequency power supply 107 : 300W HMDS flow rate : 50sccm
H2O flow rate : 250sccm
substrate temperature : 375°C
electrode distance : 25mm
power of the first high-frequency power supply 107 :
300W
power of the second high-frequency power supply 109 :
0W

| pressure (Torr) | deposited film thickness (nm) |
|---|---|
| 0.9 | 469.4 |
| 1.5 | 539.6 |
| 2.0 | 520.3 |
| 2.3 | 490.9 |

HMDS flow rate : 50sccm
$H_2O$ flow rate : 250sccm
substrate temperature : 375°C
electrode distance : 25mm
power of the first high-frequency power supply 107 :
300W
power of the second high-frequency power supply 109 :
0W

FILM FORMING METHOD AND SEMICONDUCTOR DEVICE

BACKGROUND OF THE INVENTION

1. Field of the Invention

The present invention relates to a method of forming an insulating film containing silicon, and to a semiconductor device and, more particularly to a technology valuable for forming the insulating film containing silicon having a low dielectric constant.

2. Description of the Prior Art

In recent years, miniaturization of the semiconductor device such as LSI, etc. progresses and thus wiring distances in the semiconductor device are reduced year by year. If the wiring distances are reduced in this manner, the parasitic capacitances of the wirings are increased and thus the operation speed of the semiconductor device is slowed down. Therefore, there is the possibility that the higher speed of the semiconductor device is prevented.

As one of the solutions to prevent such increase in the parasitic capacitances of the wirings, the insulating film having the low dielectric constant can be employed as the interlayer insulating film. The $SiO_2$ film is widely employed as the interlayer insulating film in the prior art. However, in order to reduce the wiring capacitances, the insulating film having the lower dielectric constant than this $SiO_2$ film must be employed. The relative dielectric constant of the $SiO_2$ film is 4.1, and up to the present there are following films that are known as the insulating film containing silicon having the lower dielectric constant than that of the $SiO_2$ film.

(1) SOG (Spin On Glass) film
   (i) HSQ (Hydrogen Silsesquioxane) film Dielectric constant 3.1 to 3.5
   (ii) MSQ (Methyl Silsesquioxane) film Dielectric constant 2.8 to 2.9
(2) FSG (Fluorinated Silicon Oxide) film Dielectric constant 3.5

With regard to the dielectric constant of above films, we referred to Table 1 set forth in "Monthly Semiconductor World", page 52, October, 1999.

SUMMARY OF THE INVENTION

It is an object of the present invention to provide a method of forming a noble insulating film containing silicon that is different from these insulating films in the prior art, and a semiconductor device using such insulating film.

According to the film forming method of the present invention, the insulating film containing silicon (hereinafter simply refer to as insulating film) is formed on the substrate by plasmanizing the compound having the siloxane bonds and the oxidizing gas to react with each other. Here the Si (silicon) atom in the "compound having the siloxane bonds" have already been bonded with O (oxygen) in the form of the siloxane bond (Si—O—Si). Therefore, in forming the film, it is difficult for C (carbon) to newly bond with the Si atom in the insulating film formed by using this compound. As a result, it is hard to form many Si—C bonds in the insulating film, and thus the number of Si—C bonds in the film is reduced.

It is generally known that the increase in the number of Si—C bonds in the film causes the increase in leakage current of the film. As described above, since the number of Si—C bonds in the film can be reduced in the insulating film formed by the film forming method of the present invention, the increase in the leakage current of the film can be suppressed.

Particularly, when $H_2O$ is used as the oxidizing gas, an amount of $NH_3$ in the insulating film can be reduced. Therefore, when the chemical amplification resist coated on the insulating film is patterned, the resist is not crosslinked by $NH_3$ and thus the resist can be patterned finely. As a result, if the chemical amplification resist is used as an etching mask, it is possible to perform desirably the fine patterning of the insulating film underlying the resist.

Also, according to another film forming method of the present invention, the insulating film is formed on the substrate in the atmosphere in which the high-frequency power is applied to the upper and lower electrodes of the parallel plate type plasma chemical vapor deposition equipment, and the reaction gas containing $(Si(CH_3)_3)_2O$ and $N_2O$ is introduced into the chamber. Here, $(Si(CH_3)_3)_2O$ is an example of the aforementioned "compound having the siloxane bond", and $N_2O$ is an example of the aforementioned oxidizing gas. Therefore, as described above, the increase in the leakage current can be reduced in the insulating film formed by this film forming method.

Also, it becomes apparent that if the high-frequency power is applied to both the upper and lower electrodes like this film forming method, the dynamic hardness of the insulating film can be increased compared to the case where the high-frequency power is applied only to the upper electrode.

In addition, according to the results of the examination made by the inventors of this application, it became apparent that if the pressure of the atmosphere in this case is set to more than 0.5 Torr, the dielectric constant of the insulating film can be reduced smaller than that of the conventional $SiO_2$ film.

Further, according to another film forming method of the present invention, the insulating film is formed on the substrate in the atmosphere in which the distance between the upper and lower electrodes of the parallel plate type plasma chemical vapor deposition equipment is set to more than 25 mm. In this case, the high-frequency power is applied only to the upper electrode and not to the lower electrode, and the reaction gas containing $(Si(CH_3)_3)_2O$ and $N_2O$ is introduced into the chamber. As described above, the increase in the leakage current of the insulating film can be reduced. Besides, according to the results of the examination made by the inventors of this application, it became apparent that if the distance between the upper electrode and the lower electrode is set to more than 25 mm in this manner, the dielectric constant of the insulating film could be lowered.

Also, according to still another film forming method of the present invention, the $Si(OR)_nH_m$ compound may be used in place of the compound having the siloxane bond. Here R denotes an alkyl group, n+m=4, and m≧0.

In this $Si(OR)_nH_m$ compound, the Si atom is not directly bonded with R but bonded with R via O (oxxygen). Hence, if the $Si(OR)_nH_m$ compound is used, Si—C bonds are difficult to be formed in the insulating film. Therefore, like the compound having the siloxane bonds, it is difficult to form a large number of Si—C bonds in the insulating film by using the $Si(OR)_nH_m$ compound, and thus the number of Si—C bonds in the film can be reduced. As a result, the increase in the leakage current due to many Si—C bonds can be reduced in this insulating film.

It should be noted that a plasma process may be employed after the formation of the insulating film, which is formed using the compound having the siloxane bonds or the $Si(OR)_nH_m$ compound, in order to improve the hygroscopicity resistance of the film. In this plasma process, the atmosphere containing at least one of $O_2$, $N_2O$, and $NH_3$ is plasmanized and then the surface of the insulating film is exposed to the plasmanized atmosphere.

According to this, $H_2O$ contained in the film and $CO_2$ formed in this plasma process by oxidizing C in the film are discharged to the outside of the film, and also unbonded bonds of Si in the film are terminated by O, N, H, etc. Therefore, unbonded bonds of Si in the insulating film can be prevented from being bonded by OH group and the like, and thus the hygroscopicity resistance of the insulating film can be improved.

DESCRIPTION OF THE PREFERRED EMBODIMENT

An embodiment of the present invention will be explained in detail with reference to the accompanying drawings hereinafter.

(1) Explanation of the plasma CVD equipment used to form an insulating film in the present invention.

Figure 1:
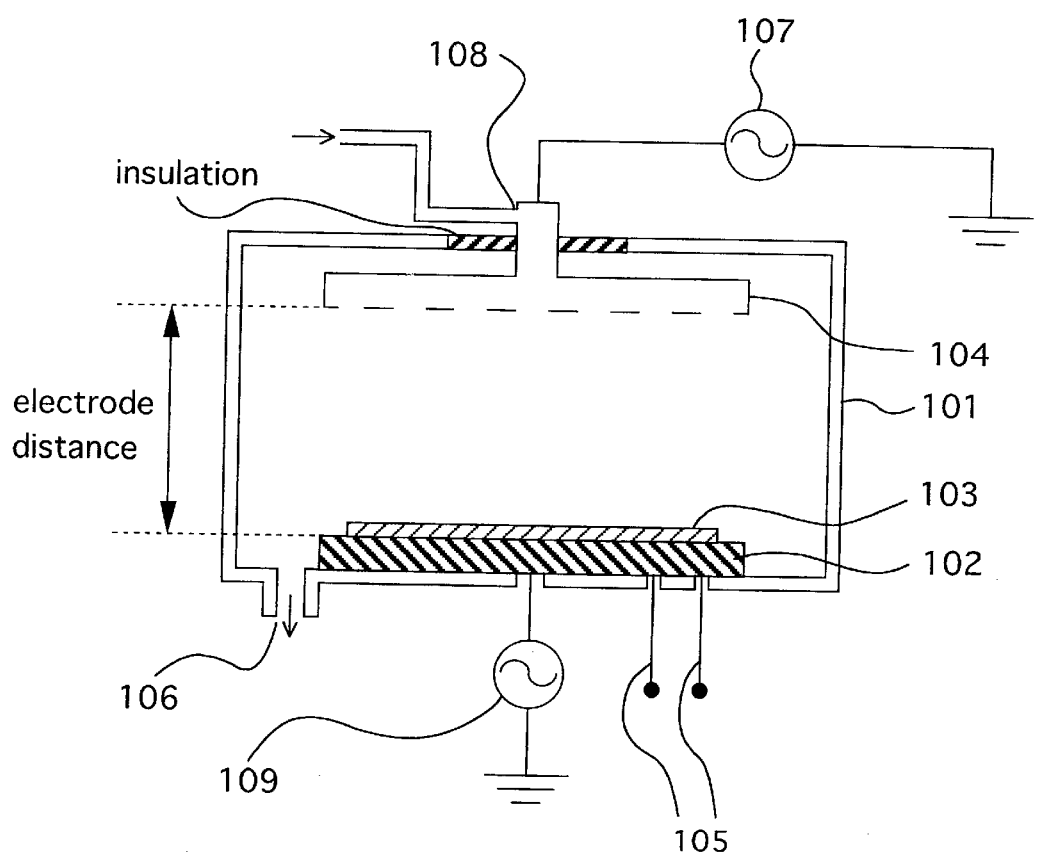
FIG. 1 is a sectional view showing a plasma CVD (Chemical Vapor Deposition) equipment used to form an insulating film containing silicon according to the present invention.

FIG. 1 is a sectional view showing the plasma CVD (Chemical Vapor Deposition) equipment used to form the insulating film containing silicon (hereinafter simply refer to as insulating film) in the present embodiment.

In FIG. 1, a reference 101 denotes a chamber used to form the film, and two opposing electrodes, i.e., a lower electrode 102 and an upper electrode 104 are provided in the chamber 101. Here, the lower electrode 102 serves also as a loading table on which a substrate 103 is loaded. A heater (not shown) for heating the substrate 103 up to the desired temperature is built in the lower electrode 102. A reference 105 denotes power supplying lines that supply a power to this heater.

Further, the upper electrode 104 serves also as a shower head that supplies a gas to an interior of the chamber 101.

A first high-frequency power supply 107 and a second high-frequency power supply 109 are connected to these two electrodes 104 and 102 respectively. The gas in the camber 101 can be plasmanized by supplying a high-frequency power to the gas in the chamber 101 from one of these high-frequency power supplies 107, 109, or from both the power supplies.

In addition, a gas introducing port 108 is provided to the upper electrode 104, and the gas is introduced into the chamber 101 via the gas introducing port 108. An exhaust port 106 is provided to the chamber 101, and the gas introduced into the chamber 101 is exhausted via the exhaust port 106 to reduce a pressure in the chamber 101.

It should be noted that since the upper electrode 104 and the lower electrode 102 are provided in the chamber 101 to oppose to each other, this plasma CVD equipment is so-called parallel plate type plasma chemical vapor deposition equipment.

(2) Explanation of the method of forming the insulating film according to the present invention.

(i) Outline

The inventors of this application have made following consideration before making the present invention.

First, it is considered that in order to form the insulating film having the low dielectric constant, the $SiO_2$ film should be formed to contain groups containing C (carbon) and H (hydrogen) in the film so as to reduce a density of the $SiO_2$ film. It is expected that when the SiO2 film is formed in this manner, Si—O bonds are disconnected at the portion where these groups exist and thus the dielectric constant of the portion is reduced, which in turn result in reducing the dielectric constant of the overall film.

Second, it is considered that when the $SiO_2$ film is formed as above, the above groups should be contained in the film not to form a large number of Si—C bonds. This is because, if a large number of Si—C bonds are formed in the film, portions in which a large number of Si—C bonds are continuously exist are formed in the film, and thus there is the possibility that the leakage currents are generated in these portions.

Third, it is considered that, in view of the first and second considerations, ① a reaction gas containing the compound having the siloxane bond (Si—O—Si) or ② a reaction gas containing the $Si(OR)_nH_m$ compound should be employed as the reaction gas used to form the film. Since the Si—O bonds are formed originally in these compounds, there is the possibility that it can be made difficult to form a large number of Si—C bonds when forming the film.

Then, examples of these compounds will be listed hereunder specifically.

① Compound having the siloxane bond (Si—O—Si)

HMDS (hexamethyldisiloxane: $(Si(CH_3)_3)_2O$)

OMCTS (octomethylcyclotetrasiloxane: $(Si(CH_3)_2)_4O_4$)

HEDS (hexaethyldisiloxane: $(Si(C_2H_5)_3)_2O$)

TMDS (tetramethyldisiloxane: $(SiH(CH_3)_2)_2O$)

TEDS (tetraethyldisiloxane: $(SiH(C_2H_5)_2)_2O$)

TMCTS (tetramethylcyclotetrasiloxane: $(SiH(CH_3))_4O_4$)

TETCS (tetraethylcyclotetrasiloxane: $(SiH(C_2H_5))_4O_4$)

These compounds are liquid at the room temperature (20° C.).

② $Si(OR)_nH_m$ compound $Si(OCH_3)_3H$ $Si(OC_2H_5)_3H$ $Si(OCH_3)_4$ $Si(OC_2H_5)_4$ These compounds are a liquid at the room temperature (20° C.). It should be noted that the $Si(OR)_nH_m$ compounds are not limited to these specific examples, but may use such a compounds satisfying n+m=4 and m≧0, where n and m denotes integer.

(ii) Explanation of film forming conditions

Figure 2A:
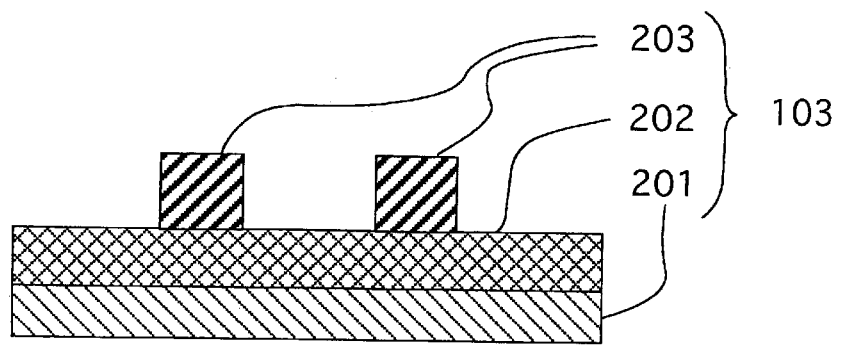
FIGS. 2A and 2B are sectional views showing a method of forming the insulating film containing silicon according to an embodiment of the present invention.
Figure 2B:
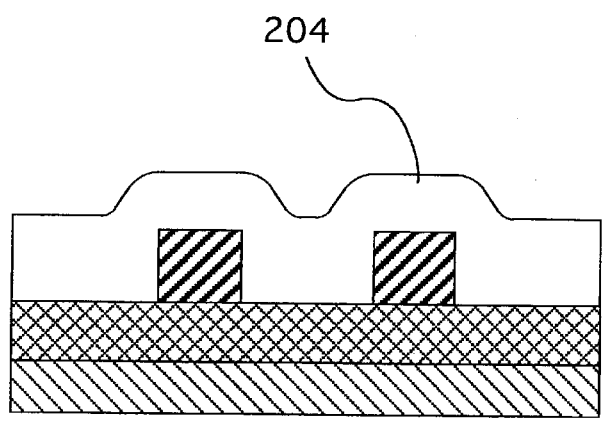

Next, film forming conditions will be explained with reference to FIGS. 2A and 2B, when the above compounds are employed to form the insulating film containing silicon. FIGS. 2A and 2B are sectional views showing a method of forming the insulating film according to an embodiment of the present invention.

At first, as shown in FIG. 2A, a silicon substrate 201 on a surface of which a BPSG (borophosphosilicate glass) film 202 is formed is prepared. Then, an aluminum film is formed on the BPSG film 202 and then aluminum wirings 203 are formed by patterning the aluminum film. These silicon substrate 201, the BPSG film 202, and the aluminum wirings 203 constitute the substrate 103.

Then, as shown in FIG. 2B, an insulating film 204 containing silicon (simply referred to as insulating film hereinafter) is formed on the substrate 103. This is performed by introducing the reaction gas via the gas introducing port 108 after the substrate 103 is loaded on the lower electrode 102 in the chamber 101 (see FIG. 1), then heating the lower electrode 102 up to the predetermined temperature, and then applying the high-frequency power to the reaction gas from the first and second high-frequency power supplies 107, 109. At the same time, an inside of the chamber 101 is set to a predetermined pressure by exhausting the reaction gas via the exhaust port 106.

As described above, as compounds contained in the reaction gas, there are ① the compound having the siloxane bond (Si—O—Si) and ② the $Si(OR)_nH_m$ compound. Two cases where these compounds are employed respectively will be explained in the following.

① the case where the compound having the siloxane bond (Si—O—Si) is used

The film forming conditions in this case will be given in Table 1.

TABLE 1

| | |
|---|---|
| Flow rate of compound having siloxane bond (Si—O—Si) | 50 sccm |
| Flow rate of an oxidizing gas | see Table 2 |
| Flow rate of an inert gas (Ar or He) | 200 sccm |
| Temperature of a substrate 103 | 350° C. |
| Pressure in a chamber 101 | 1.75 Torr |
| Frequency of the high frequency power applied by the first high- | 13.56 MHz |

TABLE 1-continued

| | |
|---|---|
| frequency power supply 107 | |
| Power of the high frequency power applied by the first high-frequency power supply 107 | 50 to 300 W |
| Frequency of the high frequency power applied by the second high-frequency power supply 109 | 380 KHz |
| Power of the high frequency power applied by the second high-frequency power supply 109 | 10 to 100 W |

As the compound having the siloxane bond (Si—O—Si) set forth in the first line of Table 1, there are HMDS, OMCTS, HEDS, TMDS, TEDS, TMCTS, and TECTS, which are already mentioned above. Any one of these compounds may be contained in the reaction gas. These compounds, which are a liquid at the room temperature, are heated to be vaporized after the flow rates of them are controlled by the liquid mass flowmeter (not shown), and then introduced into the chamber 101. Alternatively, the flow rates of these compounds may be controlled by the high-temperature mass flowmeter (not shown) after these compounds are vaporized, and then these compounds may be supplied to the chamber 101. The flow rate of the compound having the siloxane bonds given in Table 1 is the flow rate of the compound vaporized in these manners.

Also, there are $N_2O$, $O_2$, $H_2O$, $CO_2$ as the oxidizing gas set forth in the second line of Table 1, and at least one of them may be contained in the reaction gas. In case only one of these oxidizing gases is added into the reaction gas, i.e., without combination of other oxidizing gases, the flow rate of the oxidizing gas will be given in Table 2.

TABLE 2

| Oxidizing gas | Flow rate |
|---|---|
| $N_2O$ | 50 to 200 sccm |
| $O_2$ | 10 to 50 sccm |
| $H_2O$ | 100 to 300 sccm |
| $CO_2$ | 100 to 300 sccm |

The inert gas set forth in the third line of Table 1 is not essential. That is, even if such inert gas is not contained in the reaction gas, advantages similar to those described in the following can be achieved.

The dielectric constant of the insulating film 204 formed in accordance with these conditions was 2.7 at 1 MHz. This value is smaller than that of the conventional $SiO_2$ film (4.1).

The reason why the insulating film 204 having such a low dielectric constant can be formed is considered as follows. That is, as can be seen from their chemical formulas, the compounds having the siloxane bond (Si—O—Si) contain the alkyl groups such as $CH_3$, $C_2H_5$ and the like. Therefore, if the insulating film 204 is formed using these compounds, the alkyl groups are contained in the film. In the insulating film 204, the Si—O bonds are disconnected at the portions where the alkyl groups are contained, which in turn creates pores at the portions and reduce the dielectric constant of that portions. As a result, the dielectric constant of the overall insulating film 204 is lowered.

In addition, Si and O have already been bonded in the compound having the siloxane bond (Si—O—Si). Therefore, since the bonding of Si and C is limited in the insulating film 204, the Si—C bonds that cause the increase in the leakage current in the film are hard to be formed. Accordingly, it is expected that the leakage current of the insulating film 204 can be reduced compared with the case where the compound that does not have the siloxane bond (Si—O—Si) is used.

Figure 3:
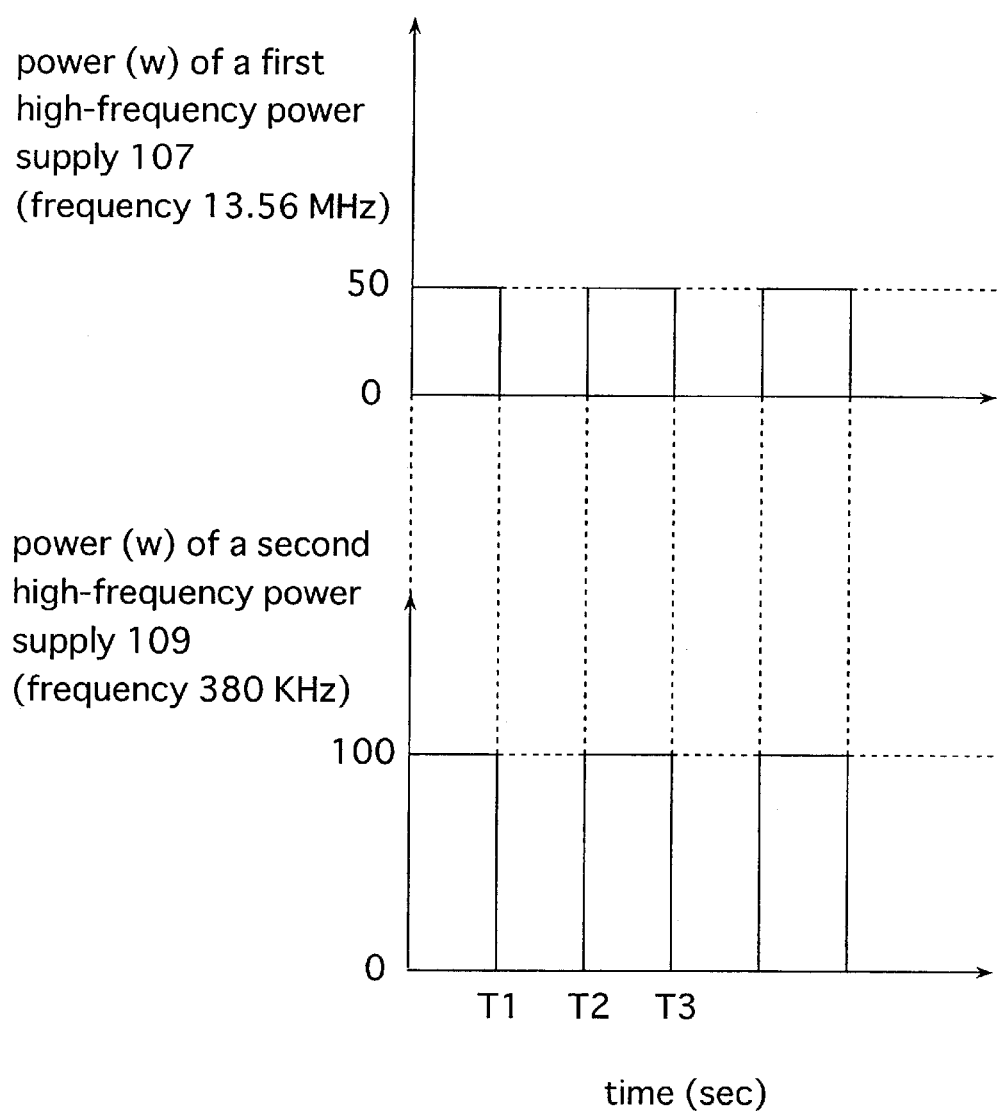
FIG. 3 is a graph showing change of high-frequency powers applied in forming the insulating film containing silicon according to the embodiment of the present invention with respect to a time.

Though the high-frequency power applied by the first and second high-frequency power supply 107 and 109 are constant in time in the film forming conditions given in Table 1 and Table 2, high-frequency power whose power varies in time as shown in FIG. 3 may also be employed in the alternative.

If the first and second high-frequency power whose power varies in time as shown in FIG. 3 is employed, the high-frequency power is applied intermittently to the reaction gas. For example, the first and second high-frequency powers are applied to the reaction gas from a time T2 to a time T3, and the high-frequency power is not applied to the reaction gas from a time T1 to a time T2. In the present embodiment, a time period during which the high-frequency power is applied, i.e., T3–T2 is $0.5 \times 10^{-3}$ sec. Then, a time period during which the high-frequency power is not applied, i.e., T2–T1 is also $0.5 \times 10^{-3}$ sec.

If the high-frequency powers whose power varies in time intermittently are employed, there is the possibility that the alkyl groups can be contained in the film in the complete form. That is, if the high-frequency powers whose power varies in time intermittently are applied, dissociation of the alkyl groups, which are contained in the compound having the siloxane bond (Si—O—Si), due to the application of the high-frequency powers can be suppressed during the time intervals in which the high-frequency powers is not applied.

Therefore, the alkyl groups which is not dissociate and thus of complete form can be contained in the insulating film 204. Accordingly, if the high-frequency powers whose power varies in time intermittently are applied, it is expected to be able to lower the dielectric constant of the insulating film 204 compared with the case where the high-frequency powers whose power is constant in time are applied.

Under the conditions shown in Table 1 and Table 2, or in case where the high-frequency powers whose power varies in time intermittently are applied under the conditions shown in Table 1 and Table 2, the methyl alcohol may be added into the reaction gas. Since the methyl groups can be contained much more in the film by the methyl alcohol, much more Si—O bonds in the film can be reduced. Therefore, it is expected that the dielectric constant of the film can be further lowered.

In order to add the methyl alcohol into the reaction gas, a flow rate of the liquid methyl alcohol is controlled by the liquid mass flowmeter (not shown), and then the liquid methyl alcohol is introduced into the chamber 101. Alternatively, the methyl alcohol may be vaporized by heating and then introduced into the chamber 101 in a gas state. When the methyl alcohol is added into the reaction gas, the flow rate of the methyl alcohol is 50 sccm.

② the case where the $Si(OR)_nH_m$ compound is used

The film forming conditions in this case will be given in Table 3.

TABLE 3

| | |
|---|---|
| Flow rate of $Si(OR)_nH_m$ compound | 50 sccm |
| Flow rate of an oxidizing gas | see Table 4 |
| Flow rate of an inert gas (Ar or He) | 200 sccm |
| Temperature of a substrate 103 | 200° C. |

TABLE 3-continued

| | |
|---|---|
| Pressure in a chamber 101 | 0.8 Torr |
| Frequency of the high frequency power applied by the first high-frequency power supply 107 | 13.56 MHz |
| Power of the high frequency power applied by the first high-frequency power supply 107 | 50 to 300 W |
| Frequency of the high frequency power applied by the second high-frequency power supply 109 | 400 KHz |
| Power of the high frequency power applied by the second high-frequency power supply 109 | 10 to 400 W |

As the $Si(OR)_nH_m$ compound set forth in Table 3, there are $Si(OCH_3)_3H$, $Si(OC_2H_5)_3H$, $Si(OCH_3)_4$, and $Si(OC_2H_5)_4$, which are already mentioned above. Also, it should be noted that the $Si(OR)_nH_m$ compounds are not limited these specific example, but may use such a compounds satisfying n+m=4 and m≧0, where n denotes integer. Any one of these compounds may be contained in the reaction gas. These compounds, which are liquid at the room temperature (20° C.), are heated to be vaporized after the flow rates of them are controlled by the liquid mass flowmeter (not shown), and then introduced into the chamber 101. Alternatively, the flow rates of these compounds may be controlled by the high-temperature mass flowmeter (not shown) after these compounds are vaporized, and then these compounds may be supplied to the chamber 101. The flow rate of the $Si(OR)_nH_m$ compound in Table 3 is the flow rate of the compound after vaporized.

Also, there are $N_2O$, $O_2$, $H_2O$, $CO_2$ as the oxidizing gas set forth in the second line of Table 3, and at least one of them may be contained in the reaction gas. In case only one of these oxidizing gases is added into the reaction gas, i.e., without combination of other oxidizing gases, the flow rate of the oxidizing gas will be given in Table 4.

TABLE 4

| Oxidizing gas | Flow rate |
|---|---|
| $N_2O$ | 50 to 200 sccm |
| $O_2$ | 10 to 50 sccm |
| $H_2O$ | 100 to 300 sccm |
| $CO_2$ | 100 to 300 sccm |

The dielectric constant of the insulating film 204 formed in accordance with these conditions was 2.5 at 1 MHz. This value is smaller than the dielectric constant 4.1 of the $SiO_2$ film used in the prior art. Also, the film forming rate was 200 nm/min.

The reason why the insulating film 204 having such a low dielectric constant can be formed is considered as follows. That is, if the $Si(OR)_nH_m$ compound is used, the alkoxy groups (OR) in the compound are contained in the film. In the insulating film 204, the Si—O bonds are disconnected at the portions where the alkoxy groups are contained, which in turn reduce the dielectric constant of that portions. As a result, the dielectric constant of the overall insulating film 204 is lowered.

In addition, Si—OR bonds have already been formed in the $Si(OR)_nH_m$ compound. Therefore, since Si and R (alkyl group) are easily bonded via O also in the insulating film 204, it can be prevented that Si and C are newly bonded to form the Si—C bonds. Accordingly, it is expected that, in the insulating film 204, the portions in which many Si—C bonds are continuously exist can be reduced compared with the case where the compound that does not have the Si—OR bond is employed. In this manner, the leakage current of the film can be reduced.

Under the conditions shown in Table 3 and Table 4, a $C_pH_q$ gas may be further added into the reaction gas. If the $C_pH_q$ gas is added, the methyl group, the ethyl group, etc. are contained in the film and thus the Si—O bonds in the film can be reduced. Therefore, it is expected that the dielectric constant of the film can be further lowered.

There are $CH_4$, $C_2H_4$, and $C_2H_6$ that are used actually as the $C_pH_q$ gas in the experiment by the inventors of this application. However, the $C_pH_q$ gas is not limited to these specific examples. At least one of these $C_pH_q$ gases may be added to the reaction gas. In case only one of these gases is added into the reaction gas, i.e., without combination of other $C_pH_q$ gases, the flow rates of these gases are 50 sccm.

(iii) Explanation of the plasma process performed to improve the hygroscopicity resistance of the insulating film By the way, as an insulating film employed in semiconductor devices, it is preferable to use insulating films that show good hygroscopicity resistance. This is because if the insulating film that shows the poor hygroscopicity resistance and is apt to absorb the moisture is employed, the moisture in the film defuses into the underlying wiring layer and thus corrosion of the wiring layer is caused.

Considering the above, in the film forming method of the present invention, in order to improve the hygroscopicity resistance of the insulating film 204 (see FIG. 2B), the plasma process is performed for the insulating film 204 after the film is formed.

The conditions of this plasma process are given in Table 5 hereunder.

TABLE 5

| (A) | (B) | (C) | (D) | (E) | (F) | (G) | (H) | (I) |
|---|---|---|---|---|---|---|---|---|
| $O_2$ | 600 | — | — | 400 | 50 | 400 | 0.2 | 60 |
| $N_2O$ | — | 600 | — | 400 | 50 | 400 | 0.2 | 60 |
| $NH_3$ | — | — | 600 | 400 | 50 | 400 | 0.2 | 60 |
| $O_2 + N_2O$ | 300 | 300 | — | 400 | 50 | 400 | 0.2 | 60 |
| $O_2 + NH_3$ | 300 | — | 300 | 400 | 50 | 400 | 0.2 | 60 |
| $N_2O + NH_3$ | — | 300 | 300 | 400 | 50 | 400 | 0.2 | 60 |
| $O_2 + N_2O + NH_3$ | 200 | 200 | 200 | 400 | 50 | 400 | 0.2 | 60 |

(A): Gas used in the plasma process
(B): $O_2$ flow rate (sccm)
(C): $N_2O$ flow rate (sccm)
(D): $NH_3$ flow rate (sccm)
(E): Power of the first high-frequency power supply 107 (W)
(F): Power of the second high-frequency power supply 109 (W)
(G): Temperature of the substrate 103 (° C.)
(H): Pressure in the chamber 101 (Torr)
(I): Process time (sec)

In this plasma process, a frequency of the high-frequency power applied by the first high-frequency power supply 107 is 13.56 MHz and a frequency of the high-frequency power applied by the second high-frequency power supply 109 is 400 kHz. As shown in the Table 5, there are $O_2$, $N_2O$, $NH_3$ as the gas employed in this plasma process, and at least one of them may be employed. In addition, Ar (argon) may be added to these gases. When Ar is added, the flow rate of Ar is 100 sccm.

If the plasma process is performed in this manner, $H_2O$ that is contained in the insulating film 204 and $CO_2$ formed in this plasma process by oxidizing C in the film are discharged to the outside of the film. Also, since unbonded bonds of Si in the film are terminated by O, N, H, etc., the unbonded bonds of Si can be prevented from being bonded by OH group and the like, which in turn improve the hygroscopicity resistance of the film.

Figure 4:
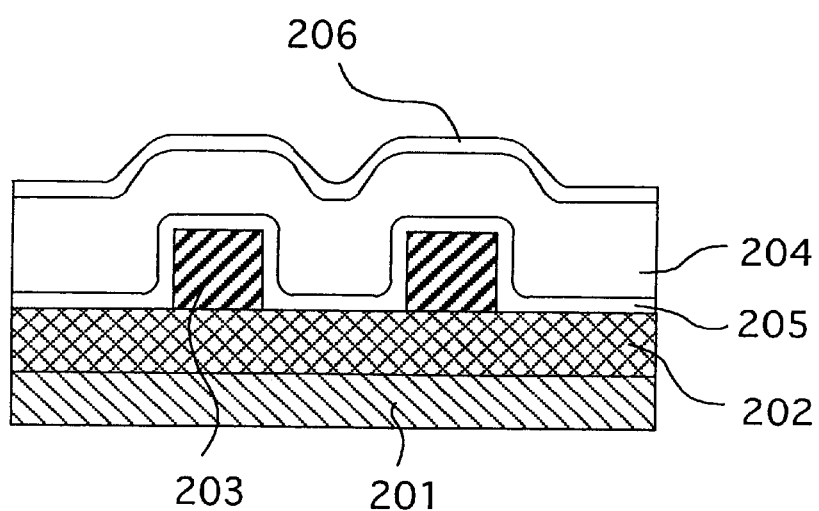
FIG. 4 is a sectional view showing a method of forming the insulating film containing silicon according to an embodiment of the present invention when an underlying insulating film and a cover insulating film are formed.

(iv) Explanation of an underlying insulating film and a cover insulating film formed to improve the hygroscopicity resistance of the insulating film In order to improve the hygroscopicity resistance of the insulating film of the present invention, the underlying insulating film and the cover insulating film may be formed under and on the insulating film 204. This will be explained with reference to FIG. 4. In FIG. 4, the same reference symbols as those used in FIG. 2 are affixed to the constituent members similar to those in FIG. 2, and their explanation will be omitted hereunder.

In FIG. 4, 205 denotes an underlying insulating film, and 206 denotes a cover insulating film. These films 205 and 206 are, for example, made up of $SiO_2$ and the like. In case where the $SiO_2$ film is employed as the underlying insulating film 205 and the cover insulating film 206, the film forming conditions of the $SiO_2$ film are given in Table 6 as follows.

TABLE 6

| | |
|---|---|
| $SiH_4$ flow rate | 50 sccm |
| $N_2O$ flow rate | 1000 sccm |
| Temperature of the substrate 103 | 400° C. |
| Pressure in the chamber 101 | 0.8 Torr |
| Frequency of the high-frequency power applied by the first high-frequency power supply 107 | 13.56 MHz |
| Power applied by the first high-frequency power supply 107 | 50 W |
| Frequency of the high-frequency power applied by the second high-frequency power supply 109 | 380 KHz |
| Power applied by the second high-frequency power supply 109 | 400 W |
| Film thickness | 50 nm |

If the underlying insulating film 205 is formed in this manner, the moisture can be prevented from entering into the inside of the substrate 103 from the upper surface (the surface contacting to the underlying insulating film 205) of the substrate 103. Therefore, corrosion of the aluminum wiring 203 by the moisture can be prevented.

Also, if the cover insulating film 206 is formed, the moisture can be prevented from entering into the inside of the insulating film 204 from the upper surface (the surface contacting to the cover insulating film 206) of the insulating film 204. Therefore, the degradation of the insulating film 204 due to the moisture can be prevented.

(v) Explanation of applying the present invention to the damascene process

In the above, the insulating film 204 of the present embodiment is formed on the aluminum wiring 203 (see FIG. 2B). However, the present invention is not limited to this, and the insulating film 204 may be applied to the damascene process suitable for forming the copper wirings. Such damascene process will be explained with reference to FIGS. 19A to 19F hereunder. FIGS. 19A to 19F are sectional views showing the case where the insulating film 204 of the present invention is applied to the damascene process.

Figure 19A:
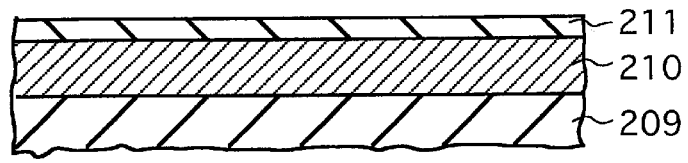
FIGS. 19A to 19F are sectional views showing a sectional shape respectively when the damascene process is applied to the insulating film 204 containing silicon according to the embodiment of the present invention.

At first, as shown in FIG. 19A, a lower copper wiring layer 210 is formed on an underlying interlayer insulating film 209, and a blocking film 211 such as the SiN film, etc. is formed on the lower copper wiring layer 210. The term blocking film is usually employed for the film when the film serves as both etching stopper film and barrier metal film.

Figure 19B:
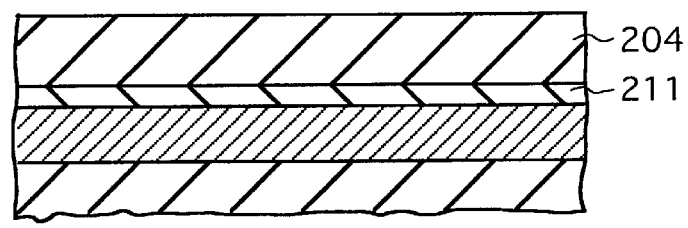

Then, as shown in FIG. 19B, the insulating film 204 of the present embodiment is formed on the blocking film 211. As previously explained, the insulating film 204 is formed by the plasma CVD method using ① the reaction gas containing the compound having the siloxane bond or ② the reaction gas containing the $Si(OR)_nH_m$ compound. The conditions in this case are the same as those set forth in Table 1 to Table 4, which have already been described. The film thickness of the insulating film 204 can be controlled desirably by changing a film forming time.

Figure 19C:
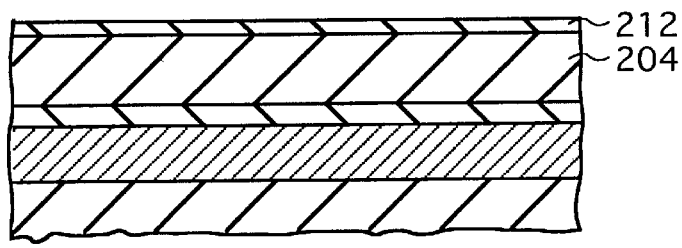

Then, as shown in FIG. 19C, a protection film 212 is formed on the insulating film 204. A dense and high quality silicon oxide film is used as the protection film 212. This protection film 212 serves to prevent the insulating film 204 from being deteriorated in an ashing process and etching process.

Figure 19D:
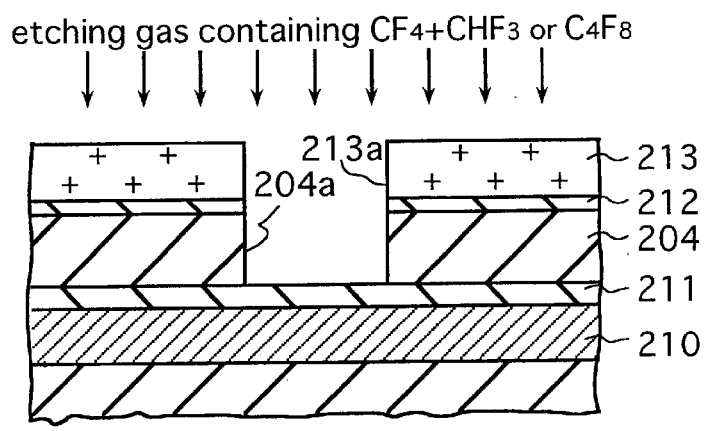

In turn, as shown in FIG. 19D, photoresist 213 is coated on the protection film 212. After this, an opening portion 213a is formed in the photoresist 213 by the photolithography. Then, the protection film 212 and the insulating film 204 are etched by the RIE (Reactive Ion Etching) while using the photoresist 213 as a mask. In this RIE, the plasmanized gas mixture containing $CF_4+CHF_3$ or $C_4F_8$ may be used as the etching gas.

Then, the insulating film 204 located under the opening portion 213a in the photoresist 213 is removed by this etching, and an opening portion 204a is formed. Then, a surface of the blocking film 211 is exposed on the bottom portion of the opening portion 204a. Since the blocking film 211 has the etching resistance against the gas mixture containing $CF_4+CHF_3$, the blocking film 211 is not etched by this RIE.

Figure 19E:
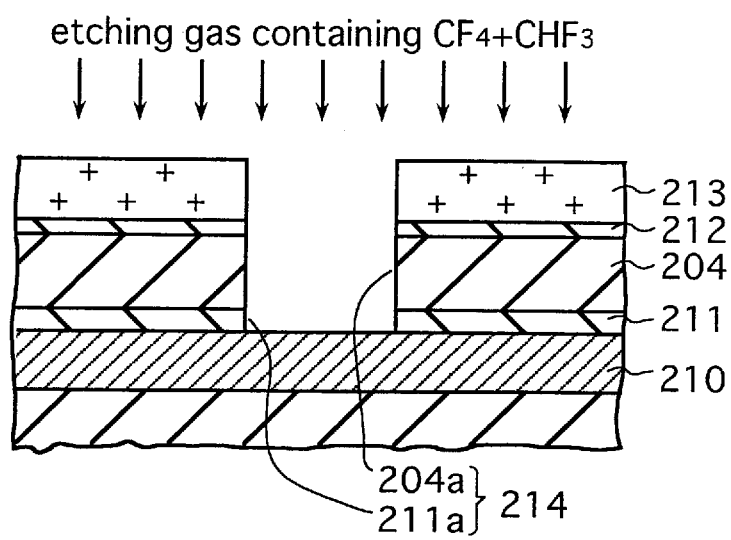

Then, as shown in FIG. 19E, the blocking film 211 is etched by the RIE while using the photoresist 213 as a mask. In this RIE, a gas mixture containing $CF_4+CHF_3$, in which the gas composition ratio is changed than that used in etching the insulating film 204, is plasmanized. By this plasmanised gas mixture, an opening portion 211a is formed in the blocking film 211 located under the opening portion 213a, and a surface of the lower copper wiring layer 210 is exposed. As a result, a via hole 214 reaching the lower copper wiring layer 210 is formed by this step.

Figure 19F:
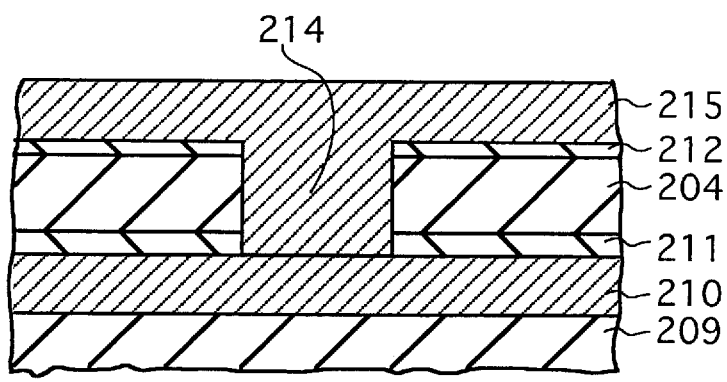

Then, as shown in FIG. 19F, after the photoresist 213 is removed and a barrier metal layer (not shown) such as a TiN film, etc. is formed on a side wall of the via hole 214, a copper plating film 215 is formed on an inner surface of the via hole 214 and an upper surface of the protection film 212. This copper plating film 215 is formed by supplying a current to a copper seed layer (not shown), which is formed on the inner surface of the via hole 214 and the upper surface of the protection film 212 by means of sputter method, etc.

After this step, the copper plating film 215 formed on the protection film 212 is removed by the CMP (Chemical Mechanical Polishing) method, and an upper copper wiring layer (not shown) is formed on the protection film 212.

According to the above mentioned damascene process, the insulating film 204 is formed as the interlayer insulating film between the lower copper wiring layer 210 and the upper copper wiring layer (not shown). This insulating film 204 is the low dielectric constant film that has the relative dielectric constant such as about 2.7 at 1 MHz, as described above. Therefore, if the insulating film 204 is employed, the wiring capacitance between the lower copper wiring layer 210 and the upper copper wiring layer (not shown) can be reduced, and therefore the semiconductor device that has the quick operation speed can be provided.

EXAMPLES

The inventors of this application examined how the property of the insulating film 204 changed when the film forming conditions were changed, especially when using HMDS (chemical formula: $(Si(CH_3)_3)_2O$) as the compound having the siloxane bond. The results of the examination will be explained in the following.

In this examination, a 8-inch silicon wafer was employed as the substrate 103 (see FIG. 1). When the relative dielectric constant of the insulating film was measured, the C-V (Capacitance-Voltage) measuring method in which the high-frequency signal of 1 MHz was superposed on the DC bias was employed. When the refractive index of the film was measured, the ellipsometer using the He—Ne laser whose wavelength is 632.8 nm was employed.

(1) The case where an electrode distance is 25 mm

At first, a distance (electrode distance) between the upper electrode 104 and the lower electrode 102 was fixed to 25 mm, and the film forming conditions were changed as follows.

(i) The case where the pressure was changed

The film forming conditions in this case are given as following Condition A.

(Condition A)

HMDS flow rate: 50 sccm $N_2O$ flow rate: 200 sccm substrate temperature: 350° C.

deposited film thickness: 500 nm frequency of the high-frequency power applied by the first high-frequency power supply 107: 13.56 MHz power of the first high-frequency power supply 107: 300 W power of the second power supply 109: 0 W In the Condition A, the high-frequency power was applied only to the upper electrode 104 and was not applied to the lower electrode 102.

Figure 5:
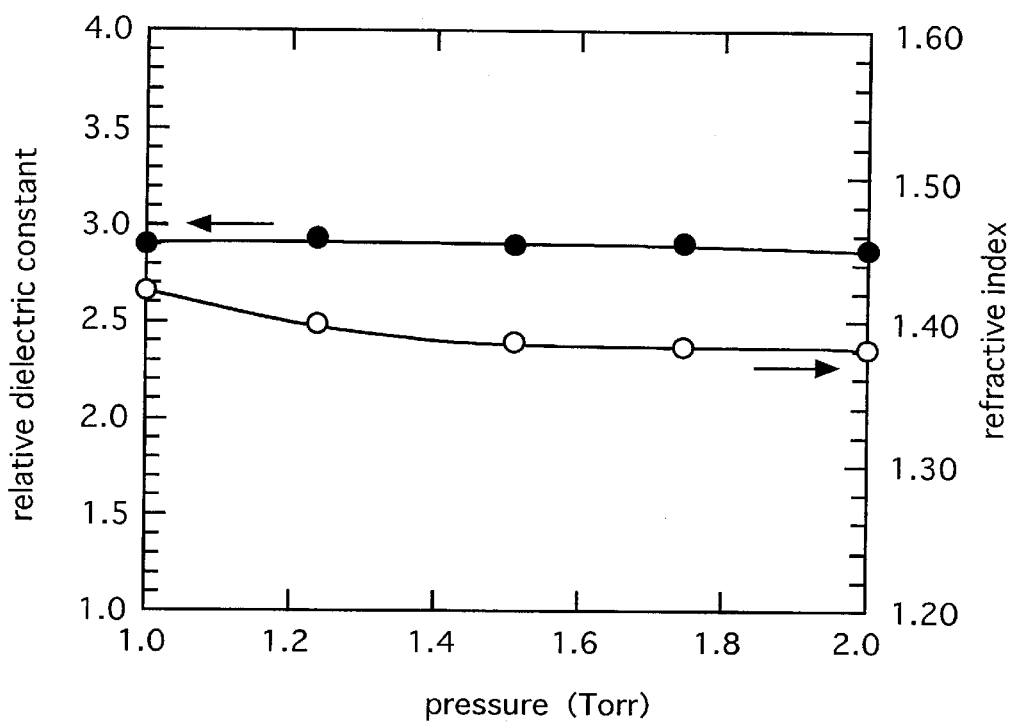
FIG. 5 is a graph showing a relationship between a relative dielectric constant of an insulating film 204 containing silicon and a pressure and a relationship between a refractive index and the pressure when a pressure of the atmosphere is changed while applying a high-frequency power only to an upper electrode 104 by setting an electrode distance to 25 mm.

When the pressure of the atmosphere was changed under the Condition A, a relationship between the relative dielectric constant of the insulating film 204 and the pressure, and a relationship between the refractive index of the film and the pressure were obtained as in FIG. 5. In FIG. 5, an arrow pointing to the left indicates that the data series dotted by ● represent the relative dielectric constant, and an arrow pointing to the right indicates that the data series dotted by ○ represent the refractive index.

As can be seen from FIG. 5, when the high-frequency power was applied only to the upper electrode 104, the relative dielectric constant was almost constant and its value showed about 2.8 even if the pressure of the atmosphere was changed. Similarly, the refractive index was almost constant and was about 1.38 to 1.42.

The leakage current of the insulating film 204 formed under the Condition A was of the order of $10^{-10}$ A/cm$^2$ at the electric field strength of 1 MV/cm over all pressures. This value is quite satisfactorily for practical use.

Next, the inventors of this application examined how the above tendency changed when the high-frequency power was applied not only to the upper electrode 104 but also to the lower electrode 102. The film forming conditions in this case are given as following Condition B.

(Condition B)

Figure 6:
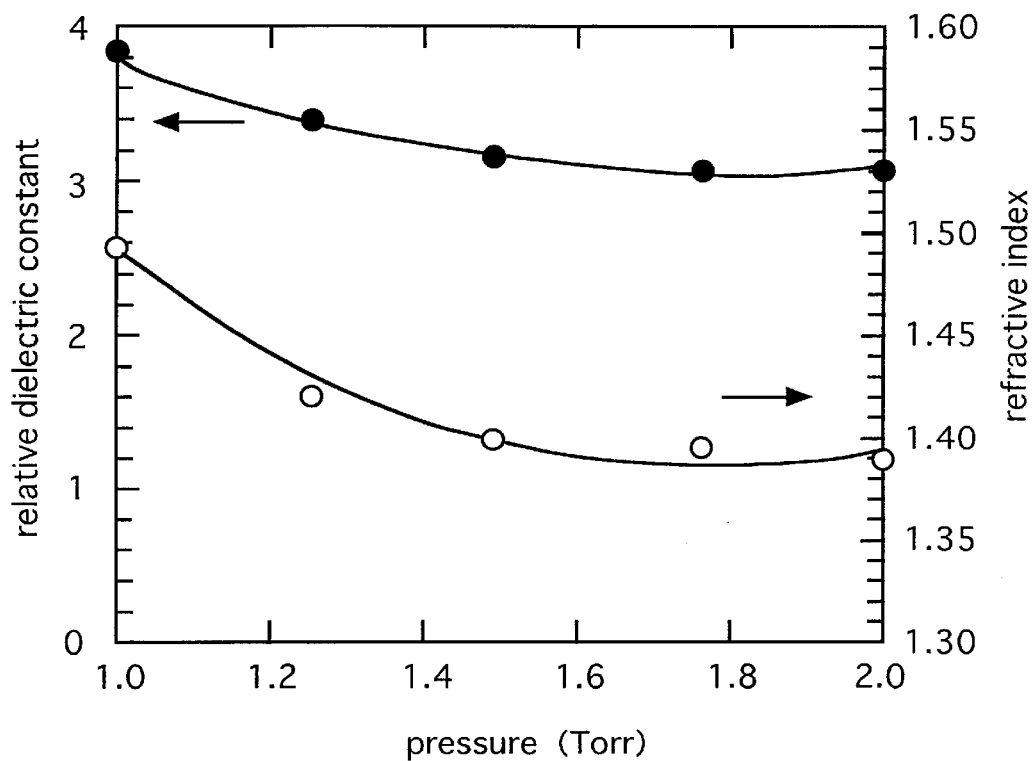
FIG. 6 is a graph showing a relationship between the relative dielectric constant of the insulating film 204 containing silicon and the pressure and a relationship between the refractive index and the pressure when the pressure of the atmosphere is changed while applying the high-frequency power to both the upper electrode 104 and a lower electrode 102 by setting the electrode distance to 25 mm.

HMDS flow rate: 50 sccm $N_2O$ flow rate: 200 sccm substrate temperature: 350° C.

deposited film thickness: 500 nm frequency of the high-frequency power applied by the first high-frequency power supply 107: 13.56 MHz power of the first high-frequency power supply 107: 300 W frequency of the high-frequency power applied by the second high-frequency power supply 109: 380 KHz power of the second power supply 109: 30 W When the pressure of the atmosphere was changed under the Condition B, a relationship between the relative dielectric constant of the insulating film 204 and the pressure, and a relationship between the refractive index of the film and the pressure were obtained as in FIG. 6.

As can be seen from FIG. 6, when the high-frequency power was applied to both the upper electrode 104 and the lower electrode 102, the tendency that is clearly different from that shown in FIG. 5 was obtained. That is, when the high-frequency power was applied to both electrodes, such a tendency appeared that, when the pressure was increased, the relative dielectric constant and the refractive index of the film ware reduced.

In FIG. 6, the value of the relative dielectric constant at the pressure of 1.0 Torr was about 3.8. In the present example, the measurement was not carried out at the pressure lower than 1.0 Torr. However, it can be understood from FIG. 6 such a tendency that the relative dielectric constant comes close to 4.0 at the pressure lower than 1.0 Torr.

As described in the prior art column, in order to provide the semiconductor device in which the wiring capacitance is reduced smaller than the prior art, the film whose relative dielectric constant is lower than that of $SiO_2$ film (4.1) must be employed as the interlayer insulating film. It can be understood from the above description that, to this end, the pressure should be set to more than 1.0 Torr and the high-frequency power should be applied to both the upper electrode 104 and the lower electrode 102.

Though the electrode distance was set to 25 mm in this example, the inventors of this application similarly examined the case where the electrode distance was set to more than 50 mm. According to this examination, it became apparent that, when the electrode distance was set to more than 50 mm, the insulating film 204 having the relative dielectric constant lower than that of the $SiO_2$ film (4.1) could be formed by setting the pressure to more than 0.5 Torr.

The leakage current of the insulating film 204 formed under the Condition B was of the order of $10^{-10}$ A/cm$^2$ at the electric field strength of 1 MV/an over all pressures. This value is quite satisfactorily for practical use.

(ii) The case where the power of the second high-frequency power supply 109 was changed As described above, it was found that, when the high-frequency power was applied not only to the upper electrode 104 but also to the lower electrode 102, the tendency that was different from the case where the high-frequency power is applied only to one electrode was obtained.

Next, the inventors of this application examined what change occurred on the property of the insulating film 204 when the power of the high-frequency power applied to one electrode was changed while applying the high-frequency power to the other electrode.

The film forming conditions in this case are given as following Condition C.

(Condition C)

Figure 7:
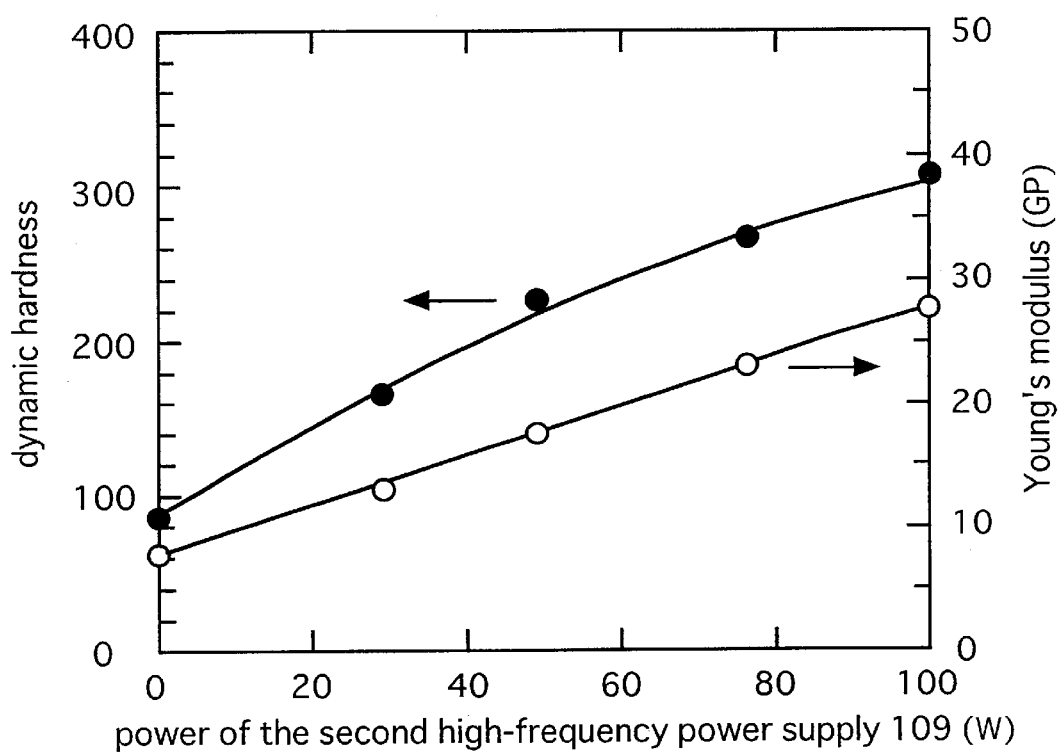
FIG. 7 is a graph showing a relationship between a power of a second high-frequency power supply 109 and a dynamic hardness of the insulating film 204 containing silicon and a relationship between the power and a Young's modulus of the insulating film 204 containing silicon when a power of the second high-frequency power supply 109 is changed by setting the electrode distance to 25 mm.

HMDS flow rate: 50 sccm $N_2O$ flow rate: 200 sccm substrate temperature: 350° C.

deposited film thickness: 500 nm frequency of the high-frequency power applied by the first high-frequency power supply 107: 13.56 MHz power of the first high-frequency power supply 107: 100 W frequency of the high-frequency power applied by the second high-frequency power supply 109: 380 KHz When the power of the second high-frequency power was changed under the Condition C, a relationship between the power of the second high-frequency power supply 109 and a dynamic hardness of the insulating film 204, and a relationship between the power of the second high-frequency power supply 109 and a Young's modulus of the insulating film 204 were obtained as shown in FIG. 7. The measurement of the dynamic hardness and Yang's modulus is carried out using the equipment DUH-W201S, which is made by Shimadzu Corporation.

As can be clearly seen from FIG. 7, the dynamic hardness and the Young's modulus of the film increases as the power of the second high-frequency power supply 109 increases. Put in another way, when the power of the second high-frequency power supply 109 is larger than 0 W, the film whose dynamic hardness and Young's modulus are larger than that obtained when the power is 0 W can be obtained. This means that if the high-frequency power is applied not only to the upper electrode 104 but also to the lower electrode 102, the film whose dynamic hardness and Young's modulus are larger than that obtained when the power is applied only to the upper electrode 104 can be obtained.

By the way, in the damascene process for forming the copper wiring layer, the damascene trench is formed in the interlayer insulating film, and the copper plating is preformed for the upper surface of the interlayer insulating film and the inside of the damascene trench. After this, in order to leave the copper only in the damascene trench, overall surface of the copper plating is polished by the CMP method. When polishing the surface by the CMP method, the interlayer insulating film, together with the copper plating thereon, is polished to some extent. If the interlayer insulating film is polished in this manner, the residual film thickness of the interlayer insulating film must be desirably controlled. In general, it has been known that in order to control the residual film thickness in the CMP, the film having the large dynamic hardness is preferable for the interlayer insulating film.

As described above, if the high-frequency power is applied to both the upper electrode 104 and the lower electrode 102, the film whose dynamic hardness is lager that obtained when the high-frequency power is applied only to the upper electrode 104 can be formed. Accordingly, it is preferable to use the insulating film 204, formed by applying the high-frequency power to both the upper and lower electrode 104 and 102, for the insulating film which undergoes the polishing in the CMP process.

The leakage current of the insulating film 204 formed under the Condition C was of the order of $10^{-10}$ A/cm$^2$ at the electric field strength of 1 MV/cm over all pressures. This value is quite satisfactorily for the practical use.

(2) The case where the electrode distance is 50 mm

The results of the examination set forth in the case (1) were derived when the electrode distance was fixed to 25 mm and the film forming conditions (except the electrode distance) were changed. However, it is considered that the property of the insulating film 204 may also changes as the electrode distance changes. Therefore, the inventors of this application examined how the property of the insulating film 204 changed by changing the electrode distance. In particular, the examination was carried out while fixing the electrode distance to 50 mm in the following.

(i) The case where the high-frequency power is applied only to the upper electrode 104 and the power of the high-frequency power is changed The film forming conditions in this case are given as following Condition D.

(Condition D)

HMDS flow rate: 50 sccm

N$_2$O flow rate: 200 sccm substrate temperature: 350° C.

deposited film thickness: 500 nm pressure: 0.9 Torr frequency of the high-frequency power applied by the first high-frequency power supply 107: 13.56 MHz power of the second high-frequency power supply 109: 0 W As can be understood from the Condition D, the high-frequency power was applied only to the upper electrode 104, and the high-frequency power was not applied to the lower electrode 102.

Figure 8:
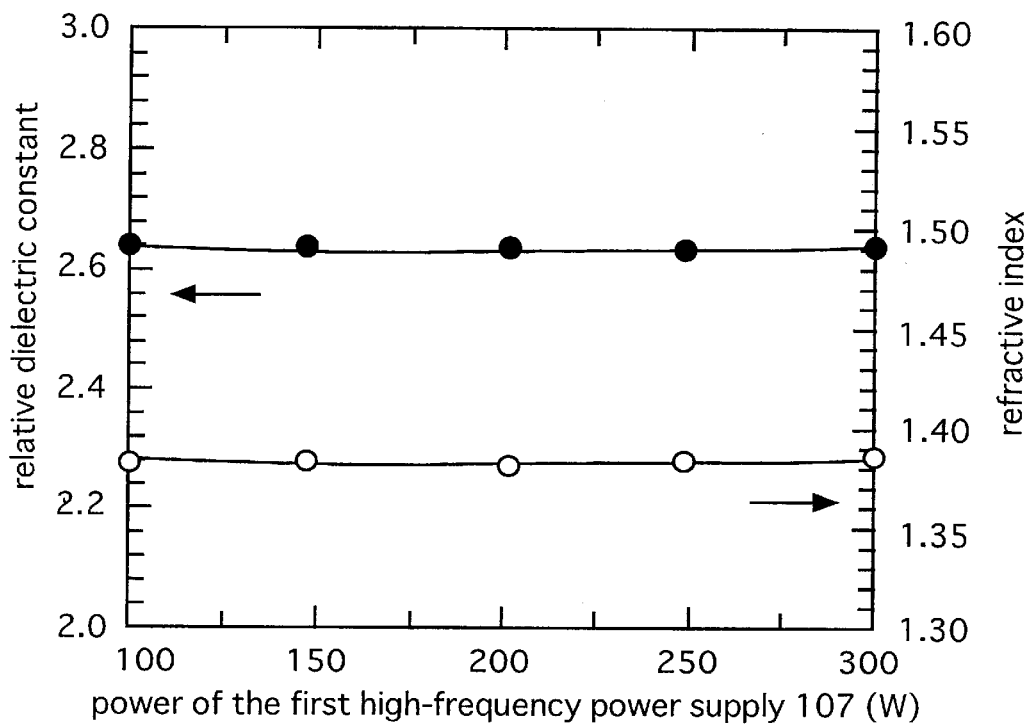
FIG. 8 is a graph showing a relationship between a power of a first high-frequency power supply 107 and the relative dielectric constant of the insulating film 204 containing silicon and a relationship between the power and a refractive index of the insulating film 204 containing silicon when a power of the first high-frequency power supply 107 is changed by setting the electrode distance to 50 mm.

When the power of the first high-frequency power supply 107 was changed under the Condition D, a relationship between the power of the first high-frequency power supply 107 and the relative dielectric constant of the insulating film 204, and a relationship between the power and the refractive index of the insulating film 204 were obtained as shown in FIG. 8.

As can be seen from FIG. 8, it can be understood that if the power of the high-frequency power was changed, the relative dielectric constant and the refractive index of the insulating film 204 were seldom changed. More specifically, the relative dielectric constant of the insulating film 204 is about 2.6 and the refractive index is about 1.38.

The leakage current of the insulating film 204 formed under the Condition D was of the order of $10^{-10}$ A/cm$^2$ at the electric field strength of 1 MV/cm over all the powers of the first high-frequency power supply 107. This value is quite satisfactorily for the practical use.

(ii) The case where the high-frequency power is applied to both the upper electrode 104 and the lower electrode 102, and the power of the high-frequency power applied to the lower electrode 102 is changed The film forming conditions in this case are given as following Condition E.

(Condition E)

HMDS flow rate: 50 sccm

Figure 9:
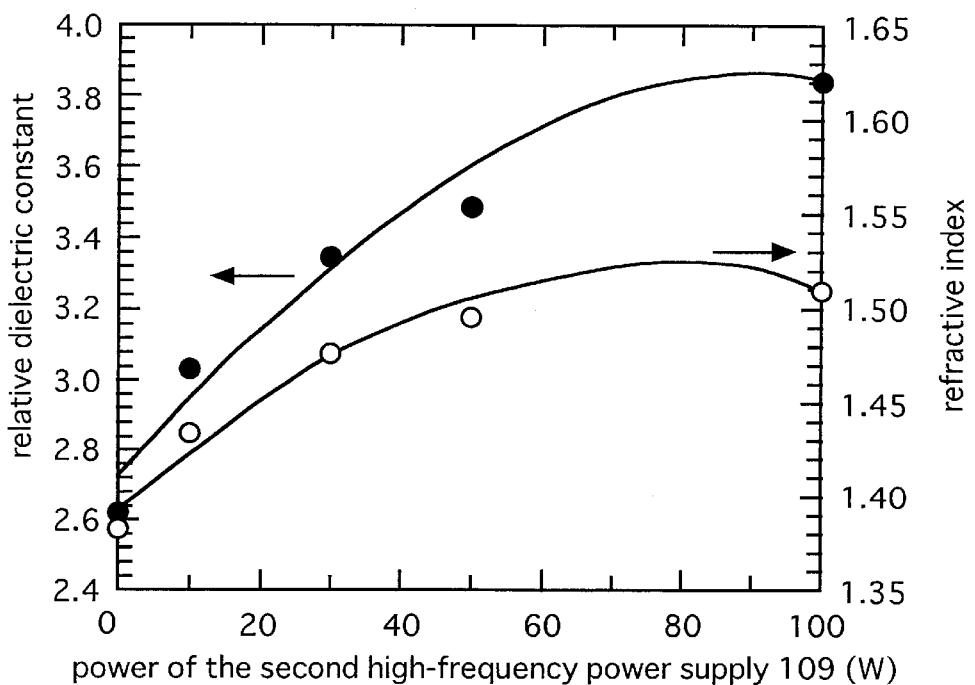
FIG. 9 is a graph showing a relationship between the power of the second high-frequency power supply 109 and the relative dielectric constant of the insulating film 204 containing silicon and a relationship between the power and the refractive index of the insulating film 204 containing silicon when the power of the second high-frequency power supply 109 is changed by setting the electrode distance to 50 mm.

N$_2$O flow rate: 200 sccm substrate temperature: 350° C.

deposited film thickness: 500 nm pressure: 0.9 Torr frequency of the high-frequency power applied by the first high-frequency power supply 107: 13.56 MHz power of the first high-frequency power supply 107: 300 W frequency of the high-frequency power applied by the second high-frequency power supply 109: 380 KHz When the power of the second high-frequency power supply 109 was changed under the Condition E, a relationship between the power of the second high-frequency power supply 109 and the relative dielectric constant of the insulating film 204, and a relationship between the power and the refractive index of the insulating film 204 were obtained as shown in FIG. 9.

As can be seen from FIG. 9, it can be understood that, if the power of the second high-frequency power supply 109 is increased, the relative dielectric constant and the refractive index of the film are increased correspondingly. However, it can be understood from FIG. 9 that the relative dielectric constant and the refractive index have their maximum values when the power of the second high-frequency power supply 109 is around 100 W, and they are reduced when the power is larger than 100 W. Also, it can be seen from FIG. 9 that the relative dielectric constant does not exceed 4.0 at the maximum value. Accordingly, even if the high-frequency power is applied to the upper electrode 104 and the lower electrode 102, the relative dielectric constant of the insulating film 204 does not exceed the relative dielectric constant (4.1) of the conventional $SiO_2$ film.

Here, in order to see how the relative dielectric constant of the insulating film 204 changed when the electrode distance was changed, FIG. 5 and FIG. 9 are compared in the following. Particularly, in order to avoid disparity in the condition other than the electrode distance, the relative dielectric constant (about 2.9) obtained when the pressure is 1.0 Torr in FIG. 5 should be compared with the relative dielectric constant (about 2.6) obtained when the power of the second high-frequency power supply 109 is 0 W in FIG. 9. These values were obtained respectively when the film forming conditions other than the electrode distance were set substantially equal. More specifically, these values were obtained when only the power of the first high-frequency power supply 107, which was 300 W, was applied and the pressure was about 1.0 Torr.

As can be seen clearly by comparing these values, the dielectric constant obtained when the electrode distance was set to 50 mm became lower than that obtained when the electrode distance was set to 25 mm. The reason for this will be given as follows. That is, if the electrode distance is large, the area (sheath area) where the gradient of the potential appears between the electrodes is relatively reduced compared with the case where the electrode distance is narrow. If the sheath area is reduced in this manner, the acceleration of the methyl groups caused by this sheath area can be suppressed and decomposition of the methyl groups can also be suppressed. Therefore, the methyl groups can be taken into the insulating film 204 with their complete form, and therefore the dielectric constant of the insulating film 204 is lowered.

Therefore, in order to lower the dielectric constant of the insulating film 204, it is preferable to expand the electrode distance. More specifically, it is preferable to set the electrode distance more than 25 mm.

The leakage current of the insulating film 204 formed under the Condition E was of the order of $10^{-10}$ A/cm$^2$ at the electric field strength of 1 MV/cm at all powers of the second high-frequency power supply 109. This value is quite satisfactorily for practical use.

(3) The case where $H_2O$ is employed as an oxidizing gas

The above results of the examination were obtained by employing $N_2O$ as the oxidizing gas. The inventors of this application examined how the property of the insulating film 204 changed when the film forming conditions were changed when using $H_2O$ as the oxidizing gas in place of $N_2O$.

(i) The case where the high-frequency power is applied only to the lower electrode 102 and the pressure is changed The film forming conditions in this case are given as following Condition F.

(Condition F)

HMDS flow rate: 50 sccm $H_2O$ flow rate: 100 sccm substrate temperature: 200° C.

deposited film thickness: 500 nm electrode distance: 25 mm power of the first high-frequency power supply 107: 0 W frequency of the high-frequency power applied by the second high-frequency power supply 109: 380 KHz power of the second high-frequency power supply 109: 100 W As can be understood from the Condition F, the high-frequency power was applied only to the lower electrode 102 and was not applied to the upper electrode 104.

Figure 10:
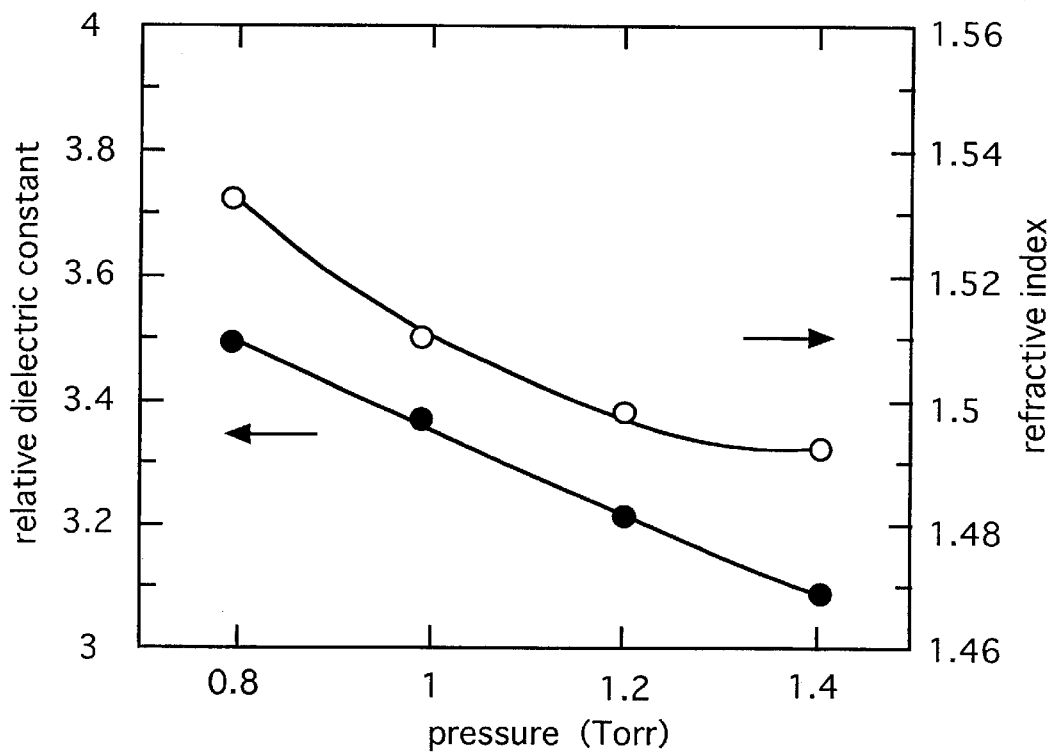
FIG. 10 is a graph showing a relationship between the relative dielectric constant of the insulating film 204 containing silicon and the pressure and a relationship between the refractive index and the pressure when the pressure of the atmosphere is changed while using $H_2O$ as an oxidizing gas by setting the electrode distance to 50 mm.

When the pressure was changed under the Condition F, a relationship between the relative dielectric constant of the insulating film 204 and the pressure, and a relationship between the refractive index and the pressure were obtained as shown in FIG. 10.

As can be seen from FIG. 10, it can be understood that the relative dielectric constant and the refractive index of the insulating film 204 are monotonously reduced as the pressure of the atmosphere is increased. It can also be understood that the relative dielectric constant of the insulating film 204 is lower than that of the conventional $SiO_2$ film (4.1) at all pressures.

The leakage current of the insulating film 204 formed under the Condition F was of the order of $10^{-10}$ A/cm$^2$ at the electric field strength of 1 MV/cm at all pressures. This value is quite satisfactorily for practical use.

(ii) The examination results of $H_2O$ contained in the film

If $H_2O$ is used as the oxidizing gas as above, there is the possibility that $H_2O$ is contained in the insulating film 204. The inventors of this application therefore examined how the $H_2O$ contained in the insulating film 204 changed when the pressure was changed under the Condition F.

Figure 11:
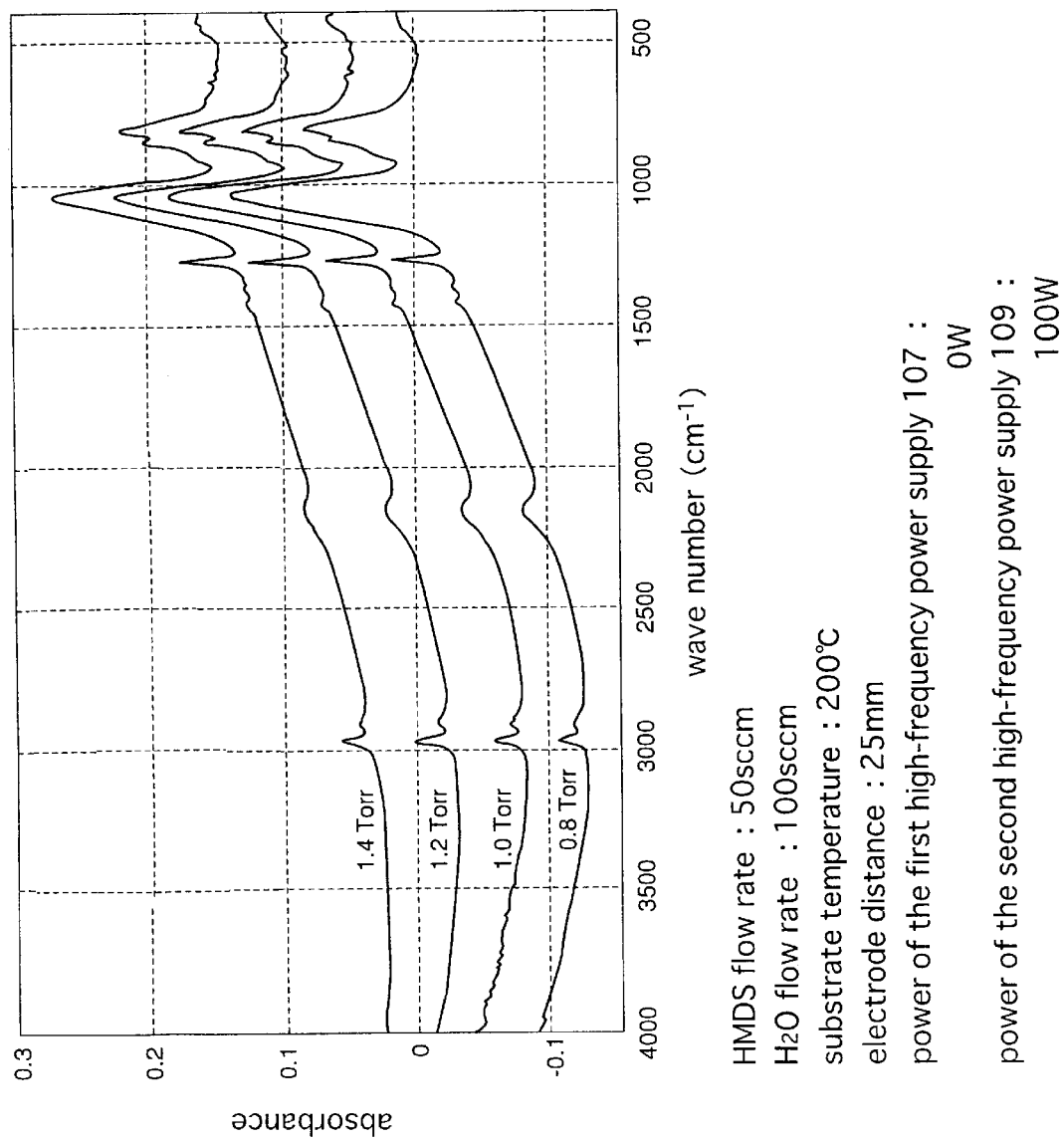
FIG. 11 is a graph showing results of the insulating film 204 containing silicon measured by the Infrared Absorption Spectroscopy when the pressure of the atmosphere is changed while using $H_2O$ as the oxidizing gas by setting the electrode distance to 25 mm.

The results of this examination are shown in FIG. 11. FIG. 11 shows the measurement results measured by the Infrared Absorption Spectroscopy.

If $H_2O$ is contained in the film, a peak appears in vicinity of the wave number of 3600 cm$^{-1}$. However, as can be seen from FIG. 11, no peak appears in vicinity of 3600 cm$^{-1}$ at all pressures. This means that regardless of the pressure of the atmosphere, no $H_2O$ is contained in the insulating film 204 that is formed in accordance with the Condition F.

In general, if $H_2O$ is contained in the interlayer insulating film, $H_2O$ diffuses into the underlying wiring layer formed under the interlayer insulating film, and such a problem arises that the wiring layer corrodes due to the diffusion of the $H_2O$. As described above, in the present embodiment, even if $H_2O$ is uses as the oxidizing gas, no $H_2O$ is contained in the insulating film 204, and thus such problem does not arise.

In addition, according to the results of another examination made by the inventors of this application, such a good result was obtained that the film thickness uniformity of the insulating film 204 is less than 3%.

(iii) The case where the high-frequency power is applied also to the upper electrode 104, and the power of the high-frequency power applied to the lower electrode 102 is changed In the Condition F, the high-frequency power is applied only to the lower electrode 102. The inventors of this application examined how the property of the insulating film 204 changed when the high-frequency power was applied also to the upper electrode 104 and the power of the high-frequency power applied to the lower electrode 102 was changed.

The film forming conditions in this case are given as following Condition G.

(Condition G)

Figure 12:
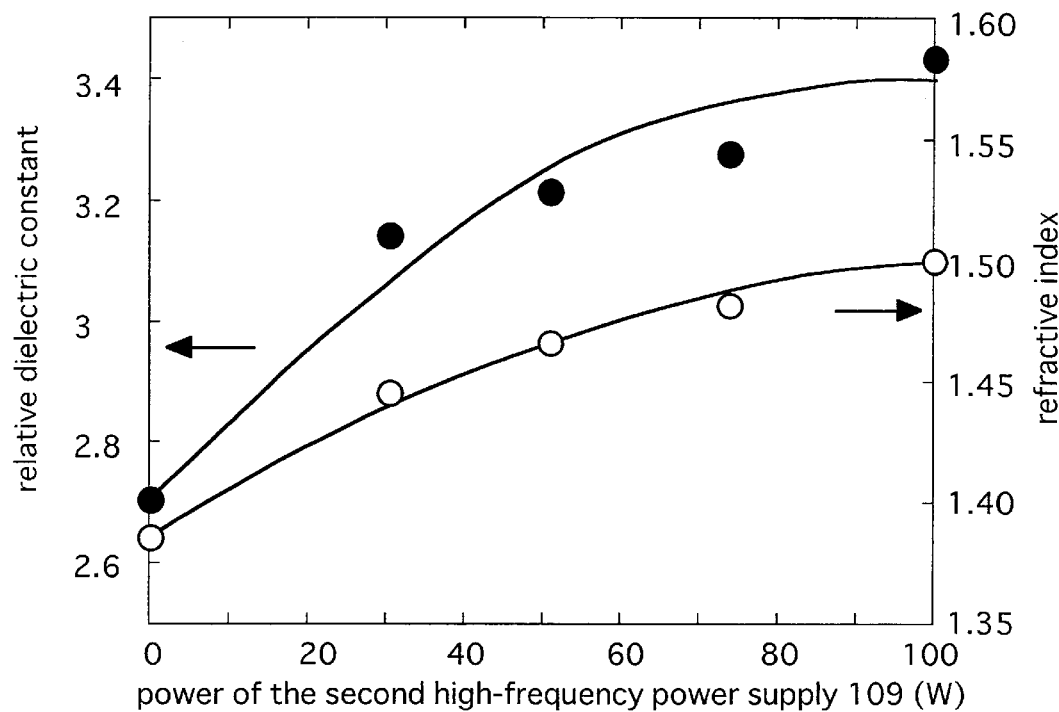
FIG. 12 is a graph showing a relationship between the power of the second high-frequency power supply 109 and the relative dielectric constant of the insulating film 204 containing silicon and a relationship between the power and the refractive index of the insulating film 204 containing silicon when the power of the second high-frequency power supply 109 is changed while using $H_2O$ as the oxidizing gas by setting the electrode distance to 25 mm.

HMDS flow rate: 50 sccm $H_2O$ flow rate: 250 sccm substrate temperature: 375° C.

deposited film thickness: 500 nm electrode distance: 25 mm pressure: 2.3 Torr frequency of the high-frequency power applied by the first high-frequency power supply 107: 13.56 MHz power of the first high-frequency power supply 107: 300 W frequency of the high-frequency power applied by the second high-frequency power supply 109: 380 KHz When the relative dielectric constant and the refractive index of the resultant insulating film 204 examined while changing the power of the high-frequency power applied by the second high-frequency power supply 109 under Condition G, the results shown in FIG. 12 were obtained.

As shown in FIG. 12, it can be understood that as the power of the second high-frequency power supply 109 is reduced, the relative dielectric constant and the refractive index of the insulating film 204 are lowered.

Next, the inventors of this application examined the leakage current of the insulating film 204 formed under the Condition G by changing variously the power of the second high-frequency power supply 109 as in the above.

Figure 13:
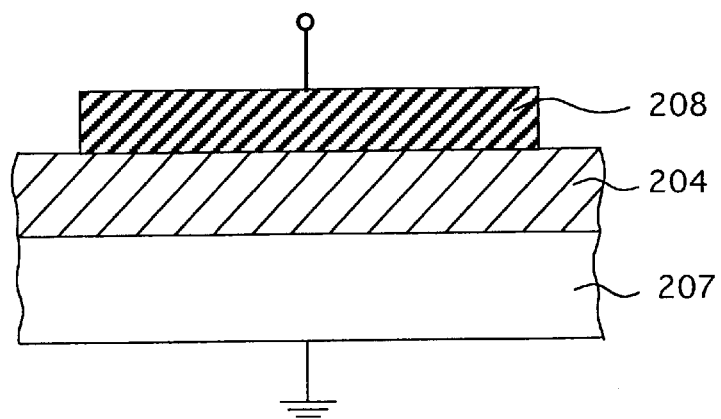
FIG. 13 is a sectional view used to explain a method of measuring a leakage current in the insulating film 204 containing silicon.

In this examination, as shown in FIG. 13, the insulating film 204 was formed on a p-type silicon substrate 207 under the Condition G. Then, with the p-type silicon substrate 207 being grounded, a mercury probe 208, which has an electrode area of 0.02258 $cm^2$, was brought into contact with the upper surface of the insulating film 204, and a negative potential is given to the mercury probe 208.

Figure 14:
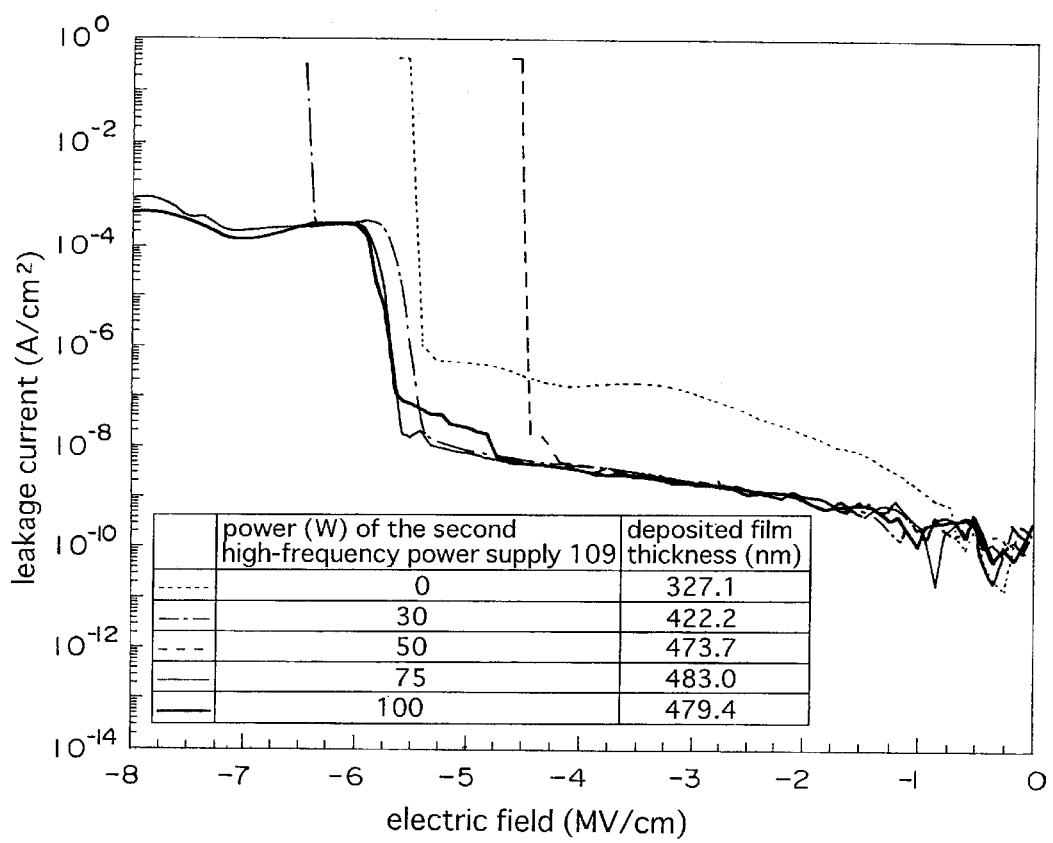
FIG. 14 is a graph showing characteristics of the leakage current in the insulating film 204 containing silicon when the power of the second high-frequency power supply 109 is changed while using $H_2O$ as the oxidizing gas by setting the electrode distance to 25 mm.

Results of the examination are shown in FIG. 14. In FIG. 14, an ordinate represents the leakage current (A/$cm^2$) of the insulating film 204 in a logarithmic scale. On the other hand, an abscissa represents the strength of the electric field (MV/cm) applied to the insulating film 204, and a (−) sign indicates that the negative potential is applied to the mercury probe 208.

As shown in FIG. 14, the leakage current is $10^{-10}$ to $10^{-9}$ A/$cm^2$ at −1 MV/cm, and this value is quite satisfactorily for practical use.

(iv) Examination results of $NH_3$ contained in the film

It is preferable that, when the insulating film 204 is used as the interlayer insulating film and chemical amplification resist is coated on the insulating film 204 for patterning, $NH_3$ is not contained in the insulating film 204. This is because, if $NH_3$ is contained in the insulating film 204, the chemical amplification resist formed on the insulating film 204 is crosslinked by the $NH_3$ when the resist undergoes patterning, and thus the desired resist pattern cannot be formed. Especially, in case where the fine pattern is required for the resist, this phenomenon becomes prominent, which poses a barrier to implement fine patterning for the underlying insulating film.

When the nitrogen oxide ($N_2O$, etc.), which serves as the oxidizing gas, is added into the reaction gas, $NH_3$ is apt to be contained in the film because of N (nitrogen) in the nitrogen oxide. In order to verify this phenomenon, the inventors of this application formed the insulating film by using $Si(CH_3)_4$ and $N_2O$, and then examined an amount of $NH_3$ in the insulating film. The film forming conditions for this insulating film are given as following Condition H.

(Condition H)

Figure 15:
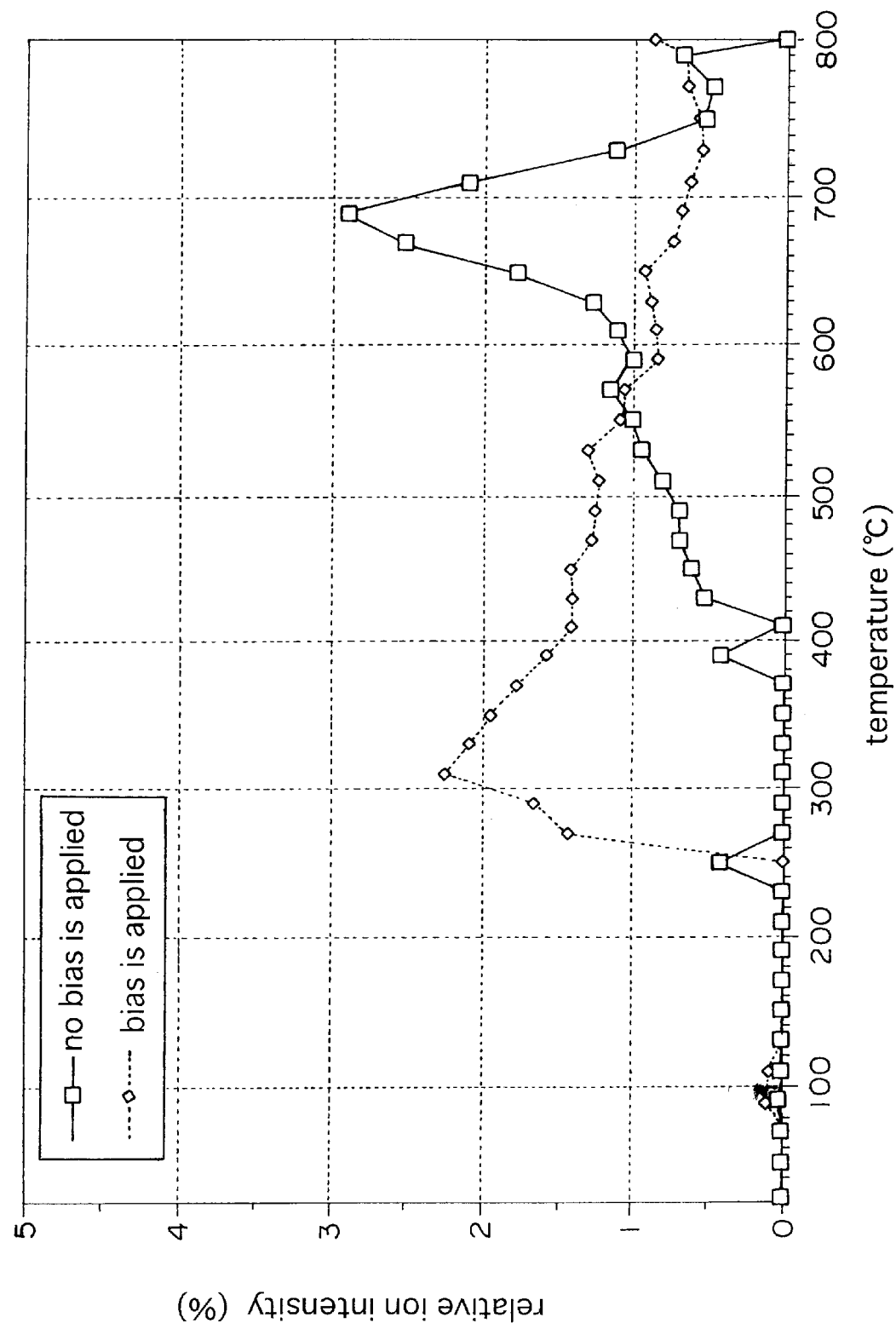
FIG. 15 is a graph showing measured results of an amount of $NH_3$, that is contained in an insulating film formed by using $Si(CH_3)_4$ and $N_2O$, measured by the TDS method.

$Si(CH_3)_4$ flow rate: 80 sccm $N_2O$ flow rate: 320 sccm substrate temperature: 350° C.

deposited film thickness: 500 nm pressure: 1 Torr frequency of the high-frequency power applied by the first high-frequency power supply 107: 13.56 MHz power of the first high-frequency power supply 107: 300 W frequency of the high-frequency power applied by the second high-frequency power supply 109: 400 KHZ power of the second high-frequency power supply 109: 30 W The results of an amount of $NH_3$ contained in the insulating film formed under the Condition H are shown in FIG. 15. FIG. 15 is graph showing the results of an amount of $NH_3$ measured by the TDS (Thermal Desorption Spectroscopy) method. An abscissa of this graph represents the temperature (° C.) at which the insulating film is heated in the measurement. On the other hand, an ordinate represents the relative ion intensity (%) of monovalent positive ion whose molecular weight is 17. Here, the relative ion intensity (%) is defined as (ion intensity of the monovalent positive ion whose molecular weight is 17)/(total ion intensity desorped by heating). $NH_3$ is ionized to $NH_3^+$ by the heating and since the $NH_3^+$ is monovalent positive ion whose molecular weight is 17, what depicted in the FIG. 15 is the relative ion intensity of the $NH_3^+$.

As can be seen from FIG. 15, it can be understood that when the bias is applied (which means the power of the second high-frequency power supply 109 is applied to the lower electrode 102 as in the condition H), $NH_3^+$ is desorped at the temperature of about 250° C. It can also be understood that when no bias is applied (which means the power of the second high-frequency power supply 109 is not applied to the lower electrode 102), $NH_3^+$ is desorped at the temperature of about 400° C.

In this manner, it can be understood that if the nitrogen oxide ($N_2O$, etc.) is used as the oxidizing gas, $NH_3$ is contained in the film regardless whether the bias is applied or not.

On the contrary, it is considered that if $H_2O$ is used as the oxidizing gas, $NH_3$ is not contained in the film. In order to verify this, the inventors of this application examined an amount of $NH_3$ contained in the insulating film 204 that is formed under the following Condition I.

(Condition I)

HMDS flow rate: 50 sccm $H_2O$ flow rate: 250 sccm substrate temperature: 375° C.

deposited film thickness: 500 nm electrode distance: 25 mm frequency of the high-frequency power applied by the first high-frequency power supply 107: 13.56 MHz power of the first high-frequency power supply 107: 300 W power of the second high-frequency power supply 109: 0 W As can be seen from the Condition I, the high-frequency power is applied only to the upper electrode 104 and is not applied to the lower electrode 102. That is, bias is not applied in the Condition I.

Figure 16:
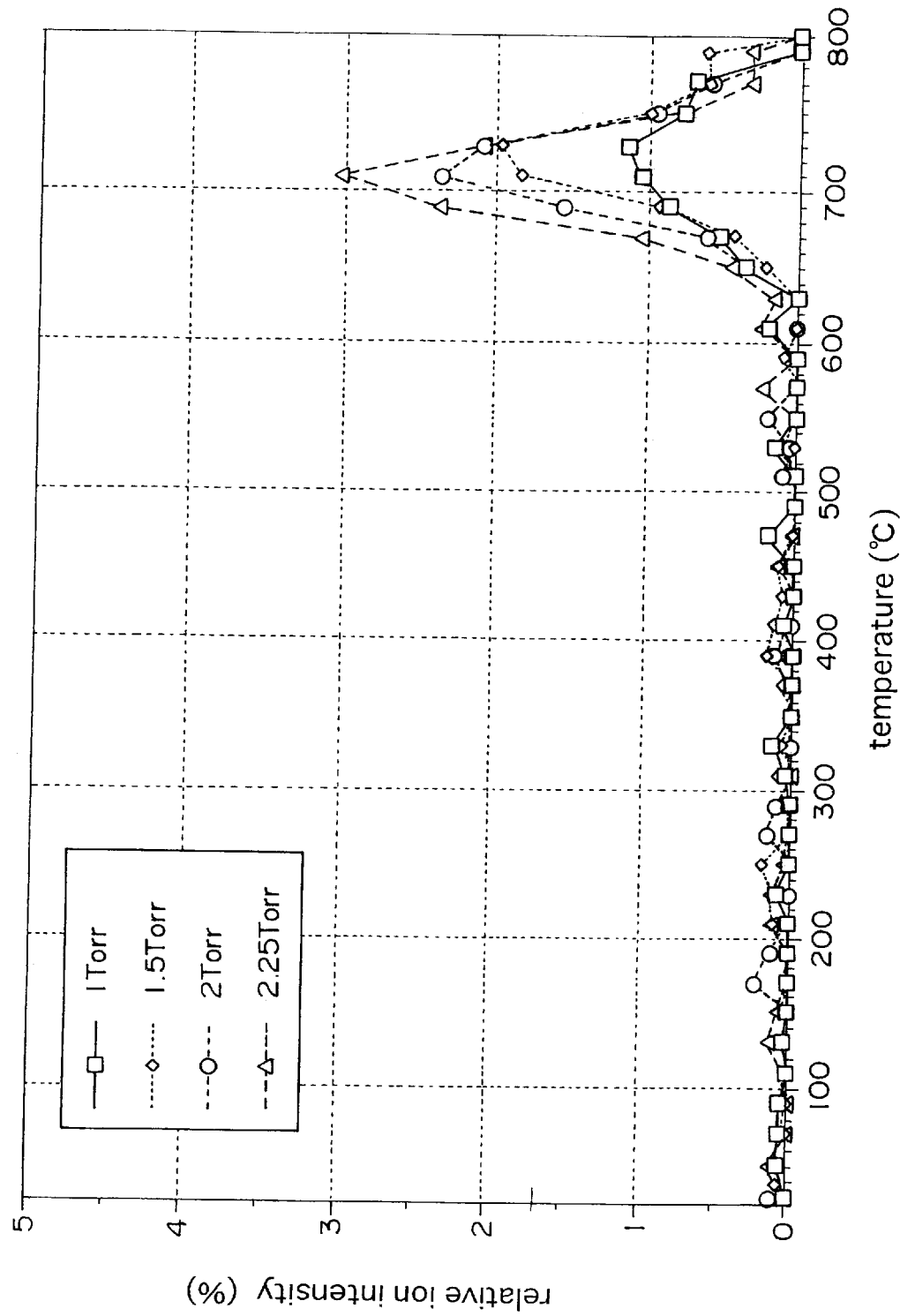
FIG. 16 is a graph showing measured results of an amount of $NH_3$, that is contained in the insulating film 204 containing silicon formed by using HMDS and $H_2O$, measured by the TDS method.

When the pressure in forming the film was changed variously under the Condition I, an amount of $NH_3$ contained in the insulating film 204 was measured as shown in FIG. 16. FIG. 16 is a graph showing the results obtained when the amount of $NH_3$ contained in the insulating film was measured by the TDS method. Since the abscissa and the ordinate of this graph are the same as those explained previously in FIG. 15, their explanation will be omitted.

Although the desorption begins at the temperature of 600° C. in FIG. 16, this is not due to $NH_3^+$ but due to the isotope of $CH_4^+$ whose molecular weight is 17. In this manner, if $H_2O$ is used as the oxidizing gas, the amount of $NH_3$ contained in the film can be largely reduced compared with the case where $N_2O$ is used as the oxidizing gas. Therefore, if the insulating film 204 is formed by using $H_2O$ as the oxidizing gas and the chemical amplification resist is formed thereon, the chemical amplification resist can be patterned with desired precision. This respect will be explained with FIGS. 20A to 20G, in which the damascene process is exemplified. FIGS. 20A to 20G are sectional views showing a sectional shape respectively when the damascene process is applied to the insulating film 204 formed by using $H_2O$ as the oxidizing gas.

Figure 20A:
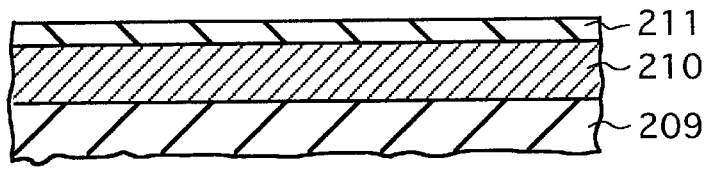
FIGS. 20A to 20G are sectional views showing a sectional shape respectively when the damascene process is applied to the insulating film 204 containing silicon formed by using $H_2O$ as the oxidizing gas according to the embodiment of the present invention.

First, as shown in FIG. 20A, a lower copper wiring layer 210 is formed on an underlying interlayer insulating film 209 and then a blocking film 211 such as an SiN film, etc. is formed thereon.

Figure 20B:
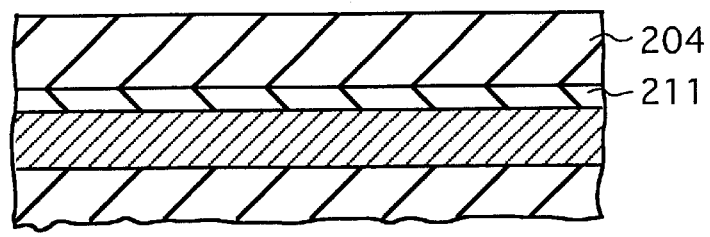

Then, as shown in FIG. 20B, the insulating film 204 is formed on the blocking film 211 under the Condition I. At this time, as described above, an amount of $NH_3$ contained in the insulating film 204 is sufficiently reduced.

Figure 20C:
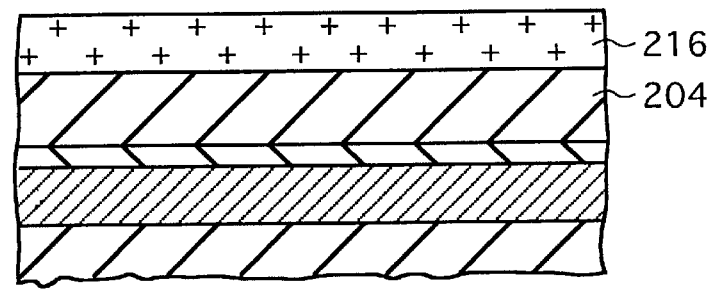

Then, as shown in FIG. 20C, chemical amplification resist 216 is coated on the insulating film 204.

Figure 20D:
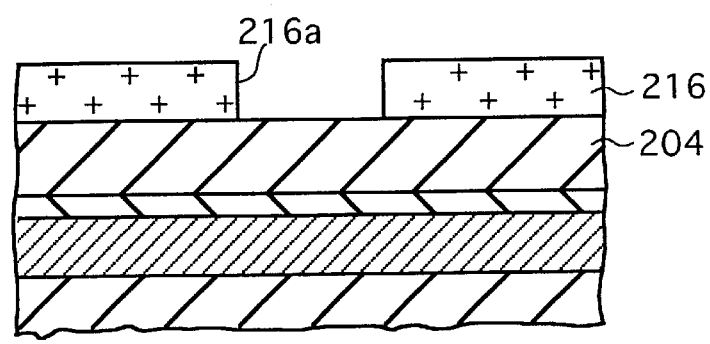

Then, as shown in FIG. 20D, an opening portion 216a is formed by patterning the chemical amplification resist 216 by virtue of the photolithography. As described above, since an amount of $NH_3$ contained in the insulating film 204 has been sufficiently reduced, the chemical amplification resist 216 is not crosslinked by $NH_3$ during undergoing this patterning. Therefore, fine pattern of the chemical amplification resist 216 can be obtained in this step, and thus a diameter of the opening portion 216a can be made small desirably.

Figure 20E:
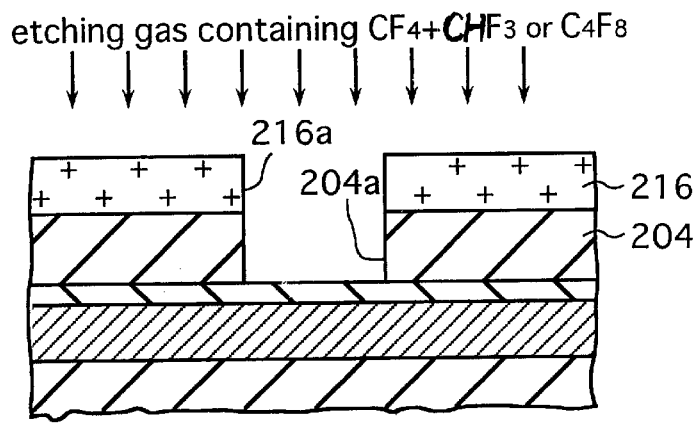

Then, as shown in FIG. 20E, using the chemical amplification resist 216 as an etching mask, an opening portion 204a is formed by etching the insulating film 204 This etching is carried out by the RIE, in which a gas mixture containing $CF_4+CHF_3$ or $C_4F_8$ is used as the etching gas. Since the pattern of the chemical amplification resist 216 is formed finely as described above, the pattern of the insulating film 204 can also be formed finely. Thus, the opening portion 204a with a small diameter can be formed in the insulating film 204. In this etching, the blocking film 211 has etching resistance against the gas mixture containing $CF_4+CHF_3$, which is used as etching gas. Therefore, the blocking film 211 is not etched by this etching.

Figure 20F:
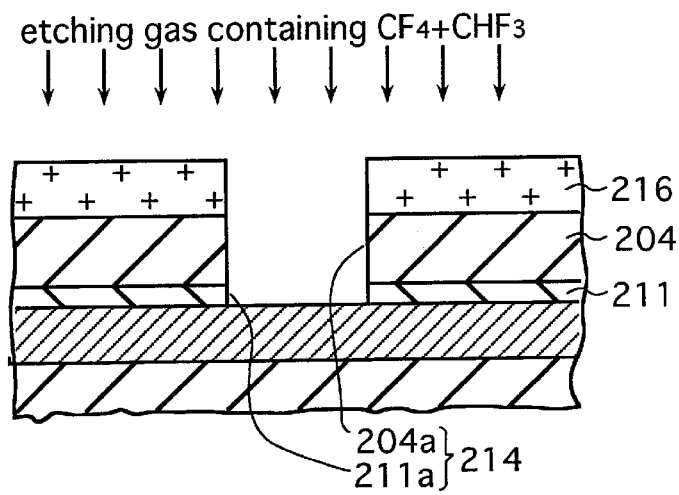

Then, as shown in FIG. 20F, using the chemical amplification resist 216 as a etching mask, the blocking film 211 is etched by the RIE. In this RIE, a gas mixture containing $CF_4+CHF_3$, in which the gas composition ratio is changed than that used in etching the insulating film 204, is plasmanized. By this plasmanised gas mixture, an opening portion 211a is formed in the blocking film 211 located under the opening portion 216a, and a surface of the lower copper wiring layer 210 is exposed. As a result, a via hole 214 reaching the lower copper wiring layer 210 is formed by this step.

Figure 20G:
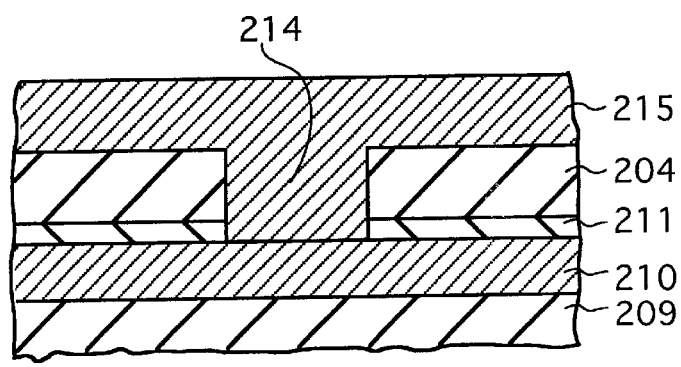

Then, as shown in FIG. 20G, after the chemical amplification resist 216 is removed, a barrier metal layer (not shown) such as the TiN film, etc. is formed on a side wall of the via hole 214, and then a copper plating film 215 is formed in the inside of the via hole 214 and on the insulating film 204. This copper plating film 215 is formed by supplying a current to a copper seed layer (not shown), which is formed on the inner surface of the via hole 214 and the upper surface of the insulating film 204 by means of sputter method, etc.

After this step, the copper plating film 215 formed on the insulating film 204 is removed by the CMP (Chemical Mechanical Polishing) method, and then an upper copper wiring layer (not shown) is formed on the insulating film 204.

As described above, if the insulating film 204 is formed by using the reaction gas containing HMDS and $H_2O$, and then the chemical amplification resist 216 is formed thereon, the chemical amplification resist 216 is not crosslinked by $NH_3$. Therefore, since the chemical amplification resist 216 can be patterned finely, the insulating film 204 can be etched finely using the chemical amplification resist 216 as a etching mask.

In this fashion, if the insulating film 204 is formed by using the reaction gas containing HMDS and $H_2O$, not only the dielectric constant of the film 204 can be lowered, but also the amount of $NH_3$ in the film 204 can be reduced and therefore the fine pattern can easily be made in the film 204.

Next, the inventors of this application examined the relative dielectric constant and the refractive index of the insulating film 204 obtained when the pressure of the atmosphere was changed under the Condition I. The examination results are shown in FIG. 17.

Figure 17:
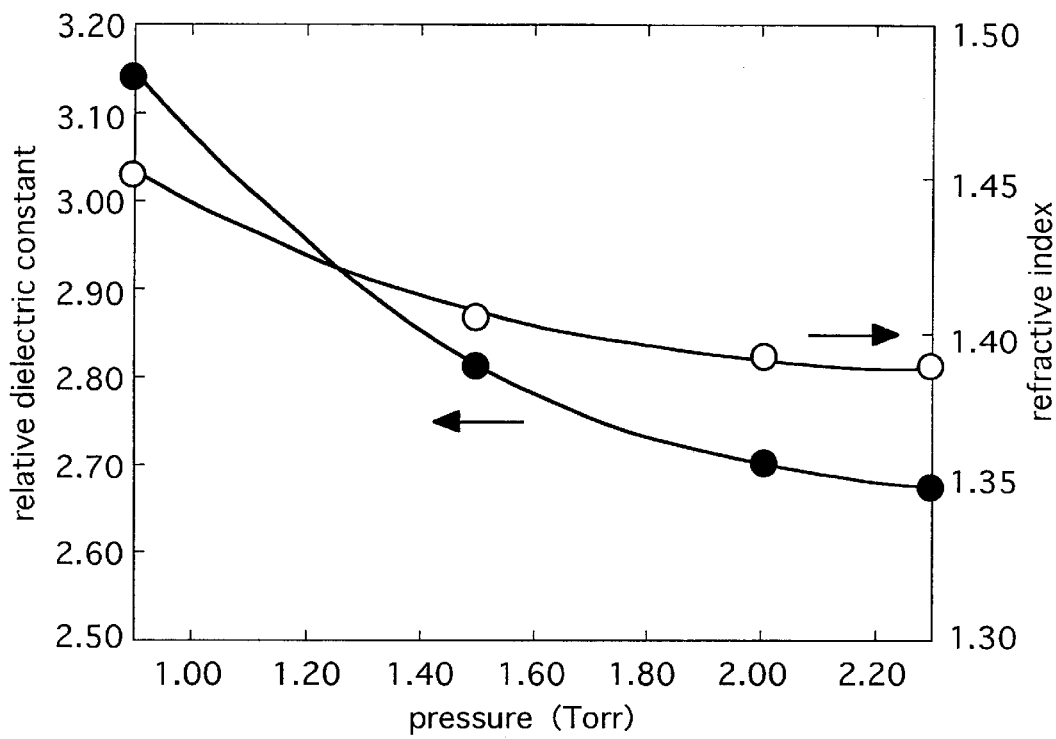
FIG. 17 is a graph showing a relationship between the pressure of the atmosphere and the relative dielectric constant of the insulating film 204 containing silicon and a relationship between the pressure and the refractive index of the insulating film 204 containing silicon when the pressure of the atmosphere is changed while using HMDS and $H_2O$.

As shown in FIG. 17, it can be understood that as the pressure is increased, both the relative dielectric constant and the refractive index reduces.

In addition, the inventors of this application examined the leakage current in the insulating film 204 formed under the same conditions as FIG. 17. Since the leakage current measuring method is the same as that explained with reference to FIG. 13, its explanation will be omitted.

Figure 18:
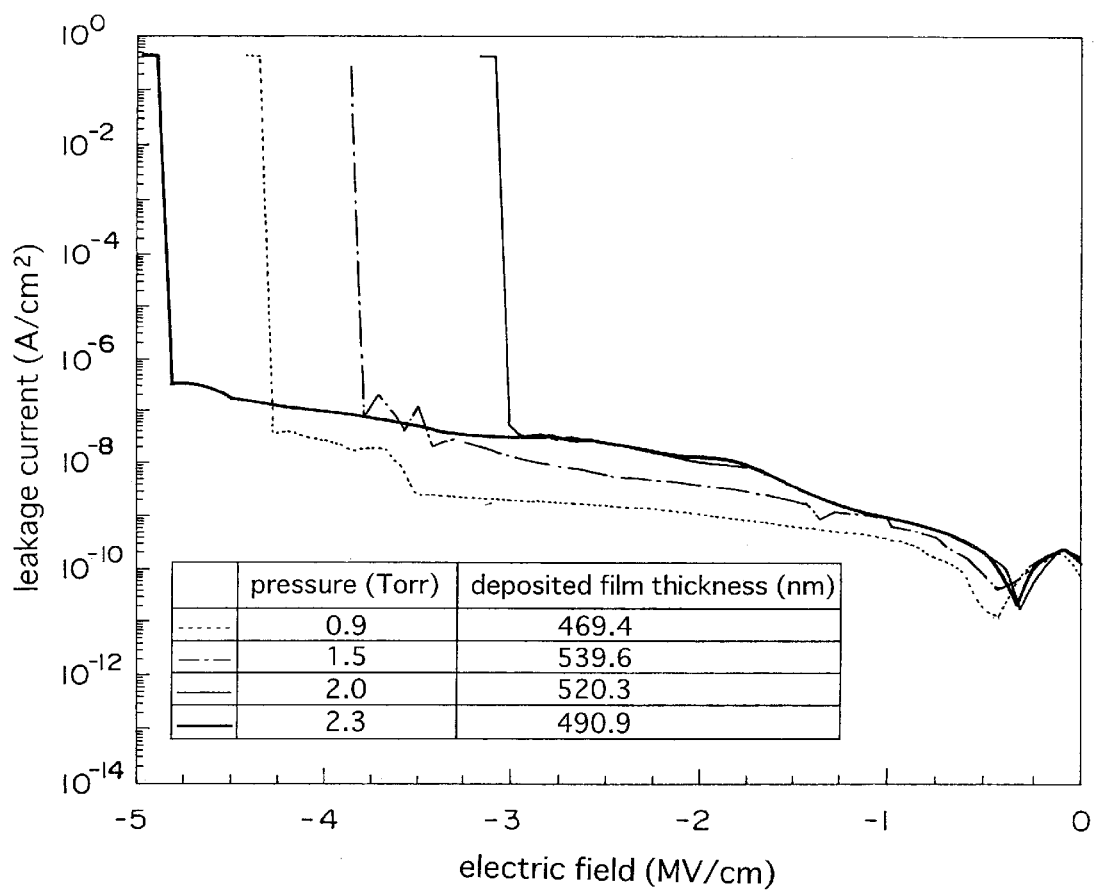
FIG. 18 is a graph showing characteristics of the leakage current in the insulating film 204 containing silicon when the pressure of the atmosphere is changed while using HMDS and $H_2O$.

The examination results are shown in FIG. 18. As shown in FIG. 18, the leakage current is $10^{-10}$ to $10^{-9}$ A/cm² at −1 MV/cm, and this value is quite satisfactorily for practical use.

As described above, according to the film forming method of the present invention, the insulating film containing silicon is formed by using the compound having the siloxane bond or the $Si(OR)_nH_m$ compound. The alkoxy or alkyl group is contained in the insulating film, and the dielectric constant of the portion of the film in which The alkoxy or alkyl group is contained is lowered, and thus the dielectric constant of the entire film is lowered.

Also, in the compound having the siloxane bond or the $Si(OR)_nH_m$ compound, Si and O have already been bonded. Therefore, when the insulating film containing silicon is formed by using these compounds, many Si—C bonds are hard to be formed in the film. Therefore, the increase in the leakage current due to the Si—C bond can be reduced in the insulating film containing silicon formed as above.

Especially, when the parallel plate type plasma chemical vapor deposition equipment is used as the film forming equipment, and also the gas containing HMDS (chemical formula: $(Si(CH_3)_3)_2O$) and $N_2O$ is used as the reaction gas, following particular advantages can be achieved respectively if the film is formed under following conditions.

(1) Applying the high-frequency power to both the upper and lower electrode.

According to this condition, the insulating film containing silicon having the larger dynamic hardness than the case where the high-frequency power is applied only to the upper electrode can be formed.

(2) Applying the high-frequency power to both the upper and lower electrode, and setting the pressure of the atmosphere to more than 0.5 Torr.

According to this condition, the insulating film containing silicon having the larger dynamic hardness than the case where the high-frequency power is applied only to the upper electrode and having the lower dielectric constant than that of the $SiO_2$ film can be formed.

(3) Applying the high-frequency power only to the upper electrode, and setting the electrode distance to more than 25 mm.

According to this condition, the insulating film containing silicon having the lower dielectric constant than the case where the high-frequency power is applied only to the upper electrode and the distance between the upper and lower electrodes is less than 25 mm can be formed.

Also, if the reaction gas containing HMDS and $H_2O$ is used, $NH_3$ is seldom contained in the resultant insulating film containing silicon. Therefore, the chemical amplification resist formed on the insulating film containing silicon is never crosslinked by $NH_3$. As a result, the resist can be finely patterned and thus the insulating film containing silicon can be finely patterned desirably.

The invention is not to be constructed as limited to the particular examples describes herein, as these are to be regarded as illustrative, rather than restrictive. The invention is intended to cover all process and structures which do not depart from the spirit and scope of the invention. For example, though in the examples and examination therein the HMDS are utilized, other compounds having the siloxane bonds such as OMCTS, HEDS, TMDS, TEDS, TMCTS, TETCS may be utilizing alternatively.

What is claimed is:

1. A film forming method for forming an insulating film containing silicon on a substrate comprising converting a mixture of a gas of a compound having siloxane bonds and an oxidizing gas to a plasma and contacting the substrate with the plasma, whereby the gases react with each other to form the insulating film on the substrate, said insulating film having a dielectric constant which is lower than that of a silicon oxide film.

2. A film forming method according to claim 1, wherein the compound having the siloxane bonds is selected from the group consisting of $(Si(CH_3)_3)_2O$, $(Si(CH_3)_2)_4O_4$, $(Si(C_2H_5)_3)_2O$, $(SiH(CH_3)_2)_2O$, $(SiH(C_2H_5)_2)_2O$, $(SiH(CH_3))_4O_4$, and $(SiH(C_2H_5))_4O_4$.

3. A film forming method according to claim 2, wherein the oxidizing gas contains at least one gas selected from the group consisting of $N_2O$, $O_2$, $H_2O$, and $CO_2$.

4. A film forming method according to claim 3, wherein an inert gas is further added to said mixture which is converted to the plasma.

5. A film forming method according to claim 1, wherein the converting to a plasma is performed by applying a high-frequency power to the mixture.

6. A film forming method according to claim 5, wherein the high-frequency power is applied intermittently to the mixture.

7. A film forming method using a parallel plate type plasma chemical vapor deposition apparatus in which an upper electrode and a lower electrode are provided opposing each other in a chamber, said method comprising:
introducing a reaction gas containing $(Si(CH_3)_3)_2O$ and $N_2O$ into the chamber with a substrate therein; and
applying high-frequency power to the electrodes to convert the reaction gas to a plasma, said plasma forming an insulating film containing silicon on the substrate, said insulating film having a dielectric constant which is lower than that of a silicon oxide film.

8. A film forming method according to claim 7, wherein pressure within the chamber is more than 0.5 Torr.

9. A film forming method using a parallel plate type plasma chemical vapor deposition apparatus in which an upper electrode and a lower electrode are provided opposing each other in a chamber and spaced apart more than 25 mm, said method comprising:
introducing a reaction gas containing $(Si(CH_3)_3)_2O$ and $N_2O$ into the chamber with a substrate therein; and
applying high-frequency power to only the upper electrode to convert the reaction gas to a plasma, said plasma forming an insulating film containing silicon on the substrate, said insulating film having a dielectric constant which is lower than that of a silicon oxide film.

10. A film forming method for forming an insulating film containing silicon on a substrate comprising converting a gaseous admixture of a gas of a $Si(OR)_nH_m$ compound (where R is an alkyl group, n and m denote integers satisfying n+m=4 and m≧0) and an oxidizing gas to a plasma and contacting the substrate with the plasma, whereby the gases react with each other to form the insulating film on the substrate.

11. A film forming method according to claim 10, wherein the $Si(OR)_nH_m$ compound is selected from the group consisting of $Si(OCH_3)_3H$, $Si(OC_2H_5)_3H$, $Si(OCH_3)_4$, and $Si(OC_2H_5)_4$.

12. A film forming method according to claim 11, wherein the oxidizing gas contains at least one compound selected from the group consisting of $N_2O$, $O_2$, $H_2O$, and $CO_2$.

13. A film forming method according to claim 10, wherein a $C_pH_q$ compound is further added to the gaseous admixture which is converted to the plasma.

14. A film forming method according to claim 13, wherein the $C_pH_q$ compound is selected from the group consisting of $CH_4$, $C_2H_4$, and $C_2H_6$.

15. A film forming method according to claim 14, wherein an inert gas is further added to the gaseous admixture which is converted to the plasma.

16. A film forming method according to claim 1, wherein a gas containing at least one of $O_2$, $N_2O$, and $NH_3$ is converted to a second plasma and, after the insulating film containing silicon is formed, a surface of the insulating film containing silicon is exposed to the second plasma.

17. A film forming method according to claim 1, wherein an underlying insulating film is formed on the substrate and the insulating film containing silicon is formed on the underlying insulating film.

18. A film forming method according to claim 1, wherein a cover insulating film is formed over the insulating film containing silicon.

19. A semiconductor device comprising the insulating film containing silicon formed by employing the film forming method set forth in claim 1.

20. A film forming method according to claim 10 wherein said oxidizing gas is $N_2O$.

* * * * *

UNITED STATES PATENT AND TRADEMARK OFFICE
CERTIFICATE OF CORRECTION

PATENT NO. : 6,642,157 B2
DATED : November 4, 2003
INVENTOR(S) : Yoshimi Shioya et al.

It is certified that error appears in the above-identified patent and that said Letters Patent is hereby corrected as shown below:

Replace Columns 1 through 24 with Columns 1 through 24.

Signed and Sealed this

Fifth Day of July, 2005

JON W. DUDAS
*Director of the United States Patent and Trademark Office*

FILM FORMING METHOD AND SEMICONDUCTOR DEVICE

BACKGROUND OF THE INVENTION

1. Field of the Invention

The present invention relates to a method of forming an insulating film containing silicon, and to a semiconductor device and, more particularly to forming an insulating film containing silicon having a low dielectric constant.

2. Description of the Prior Art

Recently, miniaturization of the semiconductor device such as LSI, etc. progresses and thus wiring spacing in semiconductor device have been reduced year by year. As wiring spacing is reduced, the parasitic capacitances of the wirings are increased and thus the operation speed of the semiconductor device is slowed down.

As one solution to such increase in the parasitic capacitances of the wirings, an insulating film having a low dielectric constant can be employed as the interlayer insulating film. $SiO_2$ film is widely employed as the interlayer insulating film in the prior art. However, in order to reduce the wiring capacitances, the insulating film having a lower dielectric constant than this $SiO_2$ film must be employed. The relative dielectric constant of the $SiO_2$ film is 4.1. To the present the following films are known as the insulating film containing silicon and having a lower dielectric constant than that of the $SiO_2$ film.

(1) SOG (Spin On Glass) film
  (i) HSQ (Hydrogen Silsesquioxane) film Dielectric constant 3.1 to 3.5.
  (ii) MSQ (Methyl Silsesquioxane) film Dielectric constant 2.8 to 2.9.
(2) FSG (Fluorinated Silicon Oxide) film Dielectric constant 3.5

With regard to the dielectric constant of above films, see Table 1 set forth in "Monthly Semiconductor World", page 52, October, 1999.

SUMMARY OF THE INVENTION

It is an object of the present invention to provide a method of forming a noble insulating film containing silicon that is different from the prior art insulating films, and a semiconductor device using such insulating film.

According to the film forming method of the present invention, the insulating film containing silicon (hereinafter simply refer to as insulating film) is formed on the substrate by plasmanizing a compound having the siloxane bonds and an oxidizing gas which react with each other to form the film. Here the Si (silicon) atom in the "compound having the siloxane bonds" is already bonded with O (oxygen) in the form of the siloxane bond (Si—O—Si). Therefore, in forming the film, it is difficult for C (carbon) to newly bond with the Si atom in the insulating film formed by using this compound. As a result, it is hard to form many Si—C bonds in the insulating film, and thus the number of Si—C bonds in the film is reduced.

It is generally known that an increase in the number of Si—C bonds in the film causes an increase in leakage current of the film. As described above, since the number of Si—C bonds in the film can be reduced in the insulating film formed by the film forming method of the present invention, an increase in the leakage current of the film is suppressed.

Particularly, when $H_2O$ is used as the oxidizing gas, the amount of $NH_3$ in the insulating film can be reduced. Therefore, when the chemical amplification resist coated on the insulating film is patterned, the resist is not crosslinked by $NH_3$ and thus the resist can be patterned finely. As a result, if a chemical amplification resist is used as an etching mask, it is possible to perform fine patterning of the insulating film underlying the resist.

Also, according to another embodiment of the film forming method of the present invention, the insulating film is formed on the substrate in an atmosphere in which high-frequency power is applied to upper and lower electrodes of a parallel plate type plasma chemical vapor deposition apparatus, and the reaction gas containing $(Si(CH_3)_3)_2O$ and $N_2O$ is introduced into the chamber. Here, $(Si(CH_3)_3)_2O$ is an example of the aforementioned "compound having the siloxane bond", and $N_2O$ is an example of the aforementioned oxidizing gas. Therefore, as described above, the increase in the leakage current can be reduced in the insulating film formed by this film forming method.

Also, it becomes apparent that if high-frequency power is applied to both the upper and lower electrodes as in this film forming method, the dynamic hardness of the insulating film can be increased as compared to the case where the high-frequency power is applied only to the upper electrode.

In addition, according to the results of experimentation by the inventors of this application, it became apparent that if the pressure of the atmosphere in this case is set to more than 0.5 Torr, the dielectric constant of the insulating film can be reduced to less than that of the conventional $SiO_2$ film.

Further, according to another embodiment of the film forming method of the present invention, the insulating film is formed on the substrate in an atmosphere in which the distance between the upper and lower electrodes of the parallel plate type plasma chemical vapor deposition equipment is set to more than 25 mm. In this case, the high-frequency power is applied only to the upper electrode and not to the lower electrode, and the reaction gas containing $(Si(CH_3)_3)_2O$ and $N_2O$ is introduced into the chamber. As described above, the increase in the leakage current of the insulating film can be reduced. Moreover, according to the results of experimentation made by the inventors of this application, it became apparent that if the distance between the upper electrode and the lower electrode is set to more than 25 mm in this manner, the dielectric constant of the insulating film could be reduced.

Also, according to still another embodiment film forming method of the present invention, a $Si(OR)_nH_m$ compound may be used in place of the compound having the siloxane bond. Here R denotes an alkyl group, n+m=4, and $m \geq 0$.

In this $Si(OR)_nH_m$ compound, the Si atom is not directly bonded with R but, rather, bonded with R via O (oxygen). Hence, if a $Si(OR)_nH_m$ compound is used, Si—C bonds are difficult to form in the insulating film. Therefore, like the compound having the siloxane bonds, it is difficult to form a large number of Si—C bonds in the insulating film by using the $Si(OR)_nH_m$ compound, and thus the number of Si—C bonds in the film can be reduced. As a result, the leakage current due to many Si—C bonds can be reduced in this insulating film.

It should be noted that a plasma process may be employed after the formation of the insulating film, which is formed using the compound having the siloxane bonds or the $Si(OR)_nH_m$ compound, in order to improve the hygroscopicity resistance of the film. In this plasma process, an atmosphere containing at least one of $O_2$, $N_2O$, and $NH_3$ is plasmanized and then the surface of the insulating film is exposed to the plasmanized atmosphere.

According to this, $H_2O$ contained in the film and $CO_2$, formed in this plasma process by oxidizing C in the film, are discharged to the outside of the film, and also unbonded bonds of Si in the film are terminated by O, N, H, etc. Therefore, unbonded bonds of Si in the insulating film can be prevented from being bonded by OH group and the like, and thus the hygroscopicity resistance of the insulating film can be improved.

BRIEF DESCRIPTION OF THE DRAWINGS

FIG. 1 is a sectional view showing a plasma CVD (Chemical Vapor Deposition) apparatus used to form an insulating film containing silicon according to the present invention;

FIGS. 2A and 2B are sectional views showing a method of forming the insulating film containing silicon according to an embodiment of the present invention;

FIG. 3 is a graph showing change of high-frequency power applied in forming the insulating film containing silicon, according to the embodiment of the present invention, with respect to a time;

FIG. 4 is a sectional view showing a method of forming the insulating film containing silicon according to an embodiment of the present invention when an underlying insulating film and a cover insulating film are formed;

FIG. 5 is a graph showing a relationship between a relative dielectric constant of an insulating film 204 containing silicon and pressure and a relationship between a refractive index and the pressure when pressure of the atmosphere is changed while applying a high-frequency power only to an upper electrode 104 by setting an electrode distance to 25 mm;

FIG. 6 is a graph showing a relationship between the relative dielectric constant of the insulating film 204 containing silicon and the pressure and a relationship between the refractive index and the pressure when the pressure of the atmosphere is changed while applying the high-frequency power to both the upper electrode 104 and a lower electrode 102 by setting the electrode distance to 25 mm;

FIG. 7 is a graph showing a relationship between power of a second high-frequency power supply 109 and dynamic hardness of the insulating film 204 containing silicon and a relationship between the power and Young's modulus of the insulating film 204 containing silicon when power of the second high-frequency power supply 109 is changed by setting the electrode distance to 25 mm;

FIG. 8 is a graph showing a relationship between power of a first high-frequency power supply 107 and the relative dielectric constant of the insulating film 204 containing silicon and a relationship between the power and refractive index of the insulating film 204 containing silicon when power of the first high-frequency power supply 107 is changed by setting the electrode distance to 50 mm;

FIG. 9 is a graph showing a relationship between the power of the second high-frequency power supply 109 and the relative dielectric constant of the insulating film 204 containing silicon and a relationship between the power and the refractive index of the insulating film 204 containing silicon when the power of the second high-frequency power supply 109 is changed by setting the electrode distance to 50 mm;

FIG. 10 is a graph showing a relationship between the relative dielectric constant of the insulating film 204 containing silicon and the pressure and a relationship between the refractive index and the pressure when the pressure of the atmosphere is changed while using $H_2O$ as an oxidizing gas by setting the electrode distance to 50 mm;

FIG. 11 is a graph showing results of the insulating film 204 containing silicon measured by Infrared Absorption Spectroscopy when the pressure of the atmosphere is changed while using $H_2O$ as the oxidizing gas by setting the electrode distance to 25 mm;

FIG. 12 is a graph showing a relationship between the power of the second high-frequency power supply 109 and the relative dielectric constant of the insulating film 204 containing silicon and a relationship between the power and the refractive index of the insulating film 204 containing silicon when the power of the second high-frequency power supply 109 is changed while using $H_2O$ as the oxidizing gas by setting the electrode distance to 25 mm;

FIG. 13 is a sectional view explaining a method of measuring leakage current in the insulating film 204 containing silicon;

FIG. 14 is a graph showing characteristics of the leakage current in the insulating film 204 containing silicon when the power of the second high-frequency power supply 109 is changed while using $H_2O$ as the oxidizing gas by setting the electrode distance to 25 mm;

FIG. 15 is a graph showing measured amount of $NH_3$, that is contained in an insulating film formed by using $Si(CH_3)_4$ and $N_2O$, measured by the TDS method;

FIG. 16 is a graph showing measured amount of $NH_3$, that is contained in the insulating film 204 containing silicon formed by using HMDS and $H_2O$, measured by the TDS method;

FIG. 17 is a graph showing a relationship between the pressure of the atmosphere and the relative dielectric constant of the insulating film 204 containing silicon and a relationship between the pressure and the refractive index of the insulating film 204 containing silicon when the pressure of the atmosphere is changed while using HMDS and $H_2O$;

FIG. 18 is a graph showing leakage current in the insulating film 204 containing silicon when the pressure of the atmosphere is changed while using HMDS and $H_2O$;

FIGS. 19A to 19F are sectional views showing a sectional shape respectively when the damascene process is applied to the insulating film 204 containing silicon according to an embodiment of the present invention; and FIGS. 20A to 20G are sectional views showing a sectional shape respectively when the damascene process is applied to the insulating film 204 containing silicon formed by using $H_2O$ as the oxidizing gas according to an embodiment of the present invention.

DESCRIPTION OF THE PREFERRED EMBODIMENT

An embodiment of the present invention will be explained in detail with reference to the accompanying drawings hereinafter.

(1) Explanation of the plasma CVD equipment used to form an insulating film in the present invention.

FIG. 1 is a sectional view showing the plasma CVD (Chemical Vapor Deposition) apparatus used to form the insulating film containing silicon (hereinafter simply referred to as "insulating film") in the present embodiment.

In FIG. 1, a chamber 101 is used to form the film, and two opposing electrodes, i.e., a lower electrode 102 and an upper electrode 104 are provided in the chamber 101. Here, the lower electrode 102 serves also as a loading table on which a substrate 103 is loaded. A heater (not shown) for heating the substrate 103 up to the desired temperature is built into the lower electrode 102. Power supplying lines 105 supply power to this heater.

Further, the upper electrode 104 serves also as a shower head that supplies a gas to the interior of the chamber 101.

A first high-frequency power supply 107 and a second high-frequency power supply 109 are connected to these two electrodes 104 and 102 respectively. The gas in the camber 101 can be plasmanized by supplying a high-frequency power to the gas in the chamber 101 from one of these high-frequency power supplies 107, 109 or from both the power supplies.

In addition, a gas introducing port 108 is provided in the upper electrode 104, and the gas is introduced into the chamber 101 via the gas introducing port 108. An exhaust port 106 is provided in the chamber 101, and the gas introduced into the chamber 101 is exhausted via the exhaust port 106 to reduce pressure in the chamber 101.

It should be noted that since the upper electrode 104 and the lower electrode 102 are provided opposing each other in the chamber 101, this plasma CVD equipment is the so-called parallel plate type plasma chemical vapor deposition apparatus.

(2) Explanation of the method of forming the insulating film according to the present invention.

(i) Outline

First, it is considered that in order to form an insulating film having a low dielectric constant, the $SiO_2$ film should be formed to contain C (carbon) and H (hydrogen) so as to reduce the density of the $SiO_2$ film. It is expected that when the $SiO_2$ film is formed in this manner, Si—O bonds are disconnected at the portion of the film where these groups exist and thus the dielectric constant of the portion is reduced, which in turn results in reducing the dielectric constant of the overall film.

Second, it is considered that when the $SiO_2$ film is formed as above, the above groups should be contained in the film, but not form a large number of Si—C bonds. This is because, if a large number of Si—C bonds are formed in the film, portions in which a large number of Si—C bonds exist are formed in the film, and thus there is the possibility that leakage currents are generated in these portions.

Third, it is considered that, in view of the first and second considerations, (1) a reaction gas containing the compound having the siloxane bond (Si—O—Si) or (2) a reaction gas containing the $Si(OR)_nH_m$ compound should be employed as the reaction gas used to form the film. Since Si—O bonds are contained in these starting compounds, there is the possibility of forming a large number of Si—C bonds in the film seems unlikely.

Examples of these starting compounds are:

(1) Compounds having the siloxane bond (Si—O—Si)
HMDS (hexamethyldisiloxane: $(Si(CH_3)_3)_2O$)
OMCTS (octomethylcyclotetrasiloxane: $(Si(CH_3)_2)_4O_4$)
HEDS (hexaethyldisiloxane: $(Si(C_2H_5)_3)_2O$)
TMDS (tetramethyldisiloxane: $(SiH(CH_3)_2)_2O$)
TEDS (tetraethyldisiloxane: $(SiH(C_2H_5)_2)_2O$)
TMCTS (tetramethylcyclotetrasiloxane: $(SiH(CH_3))_4O_4$)
TETCS (tetraethylcyclotetrasiloxane: $(SiH(C_2H_5))_4O_4$)

These compounds are liquid at the room temperature (20° C).

(2) $Si(OR)_nH_m$ compounds
$Si(OCH_3)_3H$
$Si(OC_2H_5)_3H$
$Si(OCH_3)_4$
$Si(OC_2H_5)_4$ These compounds are liquid at room temperature (20° C.). It should be noted that the $Si(OR)_nH_m$ compounds are not limited to these specific examples, but may be any compound satisfying n+m=4 and m≧0, where n and m denote integers.

(ii) Explanation of film forming conditions

Next, film forming conditions will be explained with reference to FIGS. 2A and 2B, with the above compounds employed to form the insulating film containing silicon. FIGS. 2A and 2B are sectional views showing a method of forming the insulating film according to an embodiment of the present invention.

At first, as shown in FIG. 2A, a silicon substrate 201 on a surface of which a BPSG (borophosphosilicate glass) film 202 is formed is prepared. Then, an aluminum film is formed on the BPSG film 202 and then aluminum wirings 203 are formed by patterning the aluminum film. The silicon substrate 201, the BPSG film 202, and the aluminum wirings 203 constitute the substrate 103.

Then, as shown in FIG. 2B, an insulating film 204 containing silicon (referred to hereinafter simply as "insulating film") is formed on the substrate 103. This is performed by introducing the reaction gas via the gas introducing port 108 after the substrate 103 is loaded on the lower electrode 102 in the chamber 101 (see FIG. 1), then heating the lower electrode 102 up to the predetermined temperature, and then applying the high-frequency power to the reaction gas from the first and second high-frequency power supplies 107, 109. At the same time, the interior of the chamber 101 is set to a predetermined pressure by exhausting the reaction gas via the exhaust port 106.

As described above, the reaction gas contains (1) the compound having the siloxane bond (Si—O—Si) and (2) the $Si(OR)_nH_m$ compound. Two cases where these compounds are employed respectively will be explained in the following.

(1) the case where the compound having the siloxane bond (Si—O—Si) is used

The film forming conditions in this case are given in Table 1.

TABLE 1

| | |
|---|---|
| Flow rate of compound having siloxane bond (Si—O—Si) | 50 sccm |
| Flow rate of an oxidizing gas | see Table 2 |
| Flow rate of an inert gas (Ar or He) | 200 sccm |
| Temperature of substrate 103 | 350° C. |
| Pressure in chamber 101 | 1.75 Torr |
| Frequency of the high frequency power applied by the first high-frequency power supply 107 | 13.56 MHz |
| Power of the high frequency power applied by the first high-frequency power supply 107 | 50 to 300 W |
| Frequency of the high frequency power applied by the second high-frequency power supply 109 | 380 KHz |
| Power of the high frequency power applied by the second high-frequency power supply 109 | 10 to 100 W |

Examples of the compound having the siloxane bond (Si—O—Si) set forth in the first line of Table 1, are HMDS, OMCTS, HEDS, TMDS, TEDS, TMCTS, and TECTS, which are already mentioned above. Any one of these compounds may be contained in the reaction gas. These compounds, which are liquid at the room temperature, are heated to be vaporized after their flow rates are controlled by the liquid mass flowmeter (not shown), and then introduced into the chamber 101. Alternatively, the flow rates of these compounds may be controlled by a high-temperature mass flowmeter (not shown) after these compounds are vaporized, and then these compounds may be supplied to the chamber 101. The flow rate of the compound having the siloxane bonds given in Table 1 is the flow rate of the vaporized compound.

$N_2O$, $O_2$, $H_2O$, $CO_2$ are examples of the oxidizing gas set forth in the second line of Table 1, and at least one of them may be contained in the reaction gas. When only one of these oxidizing gases is added into the reaction gas, i.e., without combination with other oxidizing gases, the flow rate of the oxidizing gas is as shown in Table 2.

TABLE 2

| Oxidizing gas | Flow rate |
| --- | --- |
| $N_2O$ | 50 to 200 sccm |
| $O_2$ | 10 to 50 sccm |
| $H_2O$ | 100 to 300 sccm |
| $CO_2$ | 100 to 300 sccm |

The inert gas set forth in the third line of Table 1 is not essential. That is, even if such inert gas is not contained in the reaction gas, advantages similar to those described in the following can be achieved.

The dielectric constant of the insulating film 204 formed in accordance with these conditions was 2.7 at 1 MHz. This value is smaller than that of the conventional $SiO_2$ film (4.1).

The reason why the insulating film 204 having such a low dielectric constant can be formed is believed to be as follows. That is, as can be seen from their chemical formulas, the compounds having the siloxane bond (Si—O—Si) contain alkyl groups such as $CH_3$, $C_2H_5$ and the like. Therefore, if the insulating film 204 is formed using these compounds, the alkyl groups are contained in the film. In the insulating film 204, the Si—O bonds are disconnected where the alkyl groups are present, which in turn creates pores at those locations and reduces their dielectric constant. As a result, the dielectric constant of the overall insulating film 204 is lowered.

In addition, Si and O are already bonded in the compound having the siloxane bond (Si—O—Si). Therefore, since the bonding of Si and C is limited in the insulating film 204, the Si—C bonds that cause the increase in the leakage current in the film are difficult to form. Accordingly, it is expected that the leakage current of the insulating film 204 can be reduced compared with the case where a compound that does not have the siloxane bond (Si—O—Si) is used.

Though the high-frequency power applied by the first and second high-frequency power supplies 107 and 109 is constant in time in the film forming conditions given in Table 1 and Table 2, high-frequency power which varies in time as shown in FIG. 3 may also be employed in the alternative.

If the power varies in time as shown in FIG. 3, the high-frequency power is applied intermittently to the reaction gas. For example, the high-frequency power is applied to the reaction gas from a time T2 to a time T3, and the high-frequency power is not applied to the reaction gas from a time T1 to a time T2. In the present embodiment, a time period during which the high-frequency power is applied, i.e., T3-T2 is $0.5 \times 10^{-3}$ sec. Then, a time period during which the high-frequency power is not applied, i.e., T2-T1 is also $0.5 \times 10^{-3}$ sec.

If the power varies in time intermittently, there is the possibility that the alkyl groups can be contained in the film in complete form. That is, if the high-frequency powers whose power varies in time intermittently, dissociation of the alkyl groups, which are contained in the compound having the siloxane bond (Si—O—Si), due to the application of the high-frequency power can be suppressed during the time intervals in which the high-frequency power is not applied.

Therefore, the alkyl groups which do not dissociate can be contained in the insulating film 204. Accordingly, if the high-frequency power varies in time intermittently is applied, it is expected that the dielectric constant of the insulating film 204 will be lower as compared with the case where the high-frequency power is constant in time.

Under the conditions shown in Table 1 and Table 2, or in the case where the high-frequency power varies in time intermittently is applied under the conditions shown in Table 1 and Table 2, methyl alcohol may be added into the reaction gas. Since more methyl groups can be contained in the film by the addition of methyl alcohol, the Si—O bonds in the film can be much reduced. Therefore, it is expected that the dielectric constant of the film can be further lowered.

In order to add the methyl alcohol into the reaction gas, flow rate of the liquid methyl alcohol is controlled by the liquid mass flowmeter (not shown), and then the liquid methyl alcohol is introduced into the chamber 101. Alternatively, the methyl alcohol may be vaporized by heating and then introduced into the chamber 101 in a gas state. When the methyl alcohol is added into the reaction gas, the flow rate of the methyl alcohol is 50 sccm.

(2) the case where the $Si(OR)_nH_m$ compound is used

The film forming conditions for this case are given in Table 3.

TABLE 3

| | |
| --- | --- |
| Flow rate of $Si(OR)_nH_m$ compound | 50 sccm |
| Flow rate of an oxidizing gas | see Table 4 |
| Flow rate of an inert gas (Ar or He) | 200 sccm |
| Temperature of substrate 103 | 200° C. |
| Pressure in chamber 101 | 0.8 Torr |
| Frequency of the high frequency power applied by the first high-frequency power supply 107 | 13.56 MHz |
| Power of the high frequency power applied by the first high-frequency power supply 107 | 50 to 300 W |
| Frequency of the high frequency power applied by the second high-frequency power supply 109 | 400 KHz |
| Power of the high frequency power applied by the second high-frequency power supply 109 | 10 to 400 W |

Examples of the $Si(OR)_nH_m$ compound in Table 3 are $Si(OCH_3)_3H$, $Si(OC_2H_5)_3H$, $Si(OCH_3)_4$, and $Si(OC_2H_5)_4$, which have already been mentioned above. Also, it should be noted that the $Si(OR)_nH_m$ compounds are not limited these specific examples, but may be such a compound satisfying n+m=4 and m≧0, where n and m denote integers. Any one of these compounds may be contained in the reaction gas. These compounds, which are liquid at room temperature (200° C.), are heated to be vaporized after their flow rates are controlled by the liquid mass flowmeter (not shown), and then introduced into the chamber 101. Alternatively, the flow rates of these compounds may be controlled by a high-temperature mass flowmeter (not shown) after they are vaporized, and then supplied to the chamber 101. The flow rate of the Si(OR)$_n$H$_m$ compound in Table 3 is the flow rate of the compound after having been vaporized.

N$_2$O, O$_2$, H$_2$O, CO$_2$ are examples of the oxidizing gas set forth in the second line of Table 3, and at least one of them may be contained in the reaction gas. In the case where only one of these oxidizing gases is added into the reaction gas, i.e., without combination with other oxidizing gases, the flow rate of the oxidizing gas will is as given in Table 4.

TABLE 4

| Oxidizing gas | Flow rate |
|---|---|
| N$_2$O | 50 to 200 sccm |
| O$_2$ | 10 to 50 sccm |
| H$_2$O | 100 to 300 sccm |
| CO$_2$ | 100 to 300 sccm |

The dielectric constant of the insulating film 204 formed in accordance with these conditions was 2.5 at 1 MHz. This value is smaller than the dielectric constant 4.1 of the SiO$_2$ film used in the prior art. Also, the film forming rate was 200 nm/min.

The reason why the insulating film 204 having such a low dielectric constant can be formed is believed to be as follows. That is, if the Si(OR)$_n$H$_m$ compound is used, the alkoxy groups (OR) of the compound are introduced into the film. In the insulating film 204, the Si—O bonds are disconnected at the locations where the alkoxy groups are contained, which in turn reduces the dielectric constant at those locations. As a result, the dielectric constant of the overall insulating film 204 is lowered.

In addition, because Si—OR bonds are contained in the Si(OR)$_n$H$_m$ compound and since Si and R (alkyl group) are easily bonded via O also in the insulating film 204, the bonding of Si and C to form the Si—C bonds is prevented. Accordingly, it is expected that, in the insulating film 204, the locations at which many Si—C bonds exist can be reduced as compared with the case where a compound that does not have the Si—OR bond is employed. In this manner, the leakage current of the film can be reduced.

Under the conditions shown in Table 3 and Table 4, a C$_p$H$_q$ gas may be further added into the reaction gas. If the C$_p$H$_q$ gas is added, the methyl group, the ethyl group, etc. are contained in the film and thus the Si—O bonds in the film can be reduced. Therefore, it is expected that the dielectric constant of the film can be further lowered.

CH$_4$, C$_2$H$_4$, and C$_2$H$_6$ were actually used as the C$_p$H$_q$ gas in the experiments reported in this application. However, the C$_p$H$_q$ gas is not limited to these specific examples. At least one of these C$_p$H$_q$ gases may be added to the reaction gas. In the case where only one of these gases is added into the reaction gas, i.e., without combination with other C$_p$H$_q$ gases, the flow rate is 50 sccm.

(iii) Explanation of the plasma process performed to improve the hygroscopicity resistance of the insulating film In semiconductor devices it is preferable to use insulating films that show good hygroscopicity resistance. This is because if the insulating film has poor hygroscopicity resistance and is apt to absorb moisture, the moisture in the film diffuses into the underlying wiring layer and thus causes corrosion of the wiring layer.

Considering the above, in the film forming method of the present invention, in order to improve the hygroscopicity resistance of the insulating film 204 (see FIG. 2B), the plasma process is performed for the insulating film 204 after the film is formed.

The conditions of this plasma process are given in Table 5 hereunder.

TABLE 5

| (A) | (B) | (C) | (D) | (E) | (F) | (G) | (H) | (I) |
|---|---|---|---|---|---|---|---|---|
| O$_2$ | 600 | — | — | 400 | 50 | 400 | 0.2 | 60 |
| N$_2$O | — | 600 | — | 400 | 50 | 400 | 0.2 | 60 |
| NH$_3$ | — | — | 600 | 400 | 50 | 400 | 0.2 | 60 |
| O$_2$ + N$_2$O | 300 | 300 | — | 400 | 50 | 400 | 0.2 | 60 |
| O$_2$ + NH$_3$ | 300 | — | 300 | 400 | 50 | 400 | 0.2 | 60 |
| N$_2$O + NH$_3$ | — | 300 | 300 | 400 | 50 | 400 | 0.2 | 60 |
| O$_2$ + N$_2$O + NH$_3$ | 200 | 200 | 200 | 400 | 50 | 400 | 0.2 | 60 |

(A): Gas used in the plasma process
(B): O$_2$ flow rate (sccm)
(C): N$_2$O flow rate (sccm)
(D): NH$_3$ flow rate (sccm)
(E): Power of the first high-frequency power supply 107 (W)
(F): Power of the second high-frequency power supply 109 (W)
(G): Temperature of the substrate 103 (° C.)
(H): Pressure in the chamber 101 (Torr)
(I): Process time (sec)

In this plasma process, the frequency of the high-frequency power applied by the first high-frequency power supply 107 is 13.56 MHz and the frequency of the high-frequency power applied by the second high-frequency power supply 109 is 400 kHz. As shown in the Table 5, O$_2$, N$_2$O, and NH$_3$ is employed as the gas in this plasma process. In addition, Ar (argon) may be added to these gases. When Ar is added, the flow rate of Ar is 100 sccm.

If the plasma process is performed in this manner, H$_2$O that is contained in the insulating film 204 and CO$_2$ formed in this plasma process by oxidizing C in the film, are discharged from the film. Also, since available bonds of Si in the film are terminated by O, N, H, etc., the available bonds of Si can be prevented from being bonded by OH group and the like, which in turn improves the hygroscopicity resistance of the film.

(iv) Explanation of an underlying insulating film and a cover insulating film formed to improve the hygroscopicity resistance of the insulating film In order to improve the hygroscopicity resistance of the insulating film of the present invention, an underlying insulating film and a cover insulating film may be formed under and on the insulating film 204. This will be explained with reference to FIG. 4. In FIG. 4, the same reference symbols as those used in FIG. 2 are affixed to members similar to those in FIG. 2, and their explanation will be omitted hereunder.

In FIG. 4, 205 denotes an underlying insulating film, and 206 denotes a cover insulating film. These films 205 and 206 are, for example, made up of SiO$_2$ and the like. In case where the SiO$_2$ film is employed as the underlying insulating film 205 and the cover insulating film 206, the film forming conditions for the SiO$_2$ film are given in Table 6 as follows.

TABLE 6

| SiH$_4$ flow rate | 50 sccm |
|---|---|
| N$_2$O flow rate | 1000 sccm |
| Temperature of the substrate 103 | 400° C. |
| Pressure in the chamber 101 | 0.8 Torr |
| Frequency of the high-frequency power applied by the first high-frequency power supply 107 | 13.56 MHz |
| Power applied by the first high-frequency power supply 107 | 50 W |

TABLE 6-continued

| | |
|---|---|
| Frequency of the high-frequency power applied by the second high-frequency power supply 109 | 380 KHz |
| Power applied by the second high-frequency power supply 109 | 400 W |
| Film thickness | 50 nm |

If the underlying insulating film 205 is formed in this manner, the moisture can be prevented from entering the interior of the substrate 103 from the upper surface (the surface contacting the underlying insulating film 205) of the substrate 103. Therefore, corrosion of the aluminum wiring 203 by moisture can be prevented.

Also, if a cover insulating film 206 is formed, the moisture can be prevented from entering into the interior of the insulating film 204 from the upper surface (the surface contacting the cover insulating film 206) of the insulating film 204. Therefore, the degradation of the insulating film 204 due to the moisture can be prevented.

(v) Explanation of applying the present invention to the damascene process

In the above, the insulating film 204 of the present embodiment is formed on the aluminum wiring 203 (see FIG. 2B). However, the present invention is not limited to this, and the insulating film 204 may be applied to the damascene process suitable for forming the copper wirings. The damascene process will now be explained with reference to FIGS. 19A to 19F.

As shown in FIG. 19A, a lower copper wiring layer 210 is first formed on an underlying interlayer insulating film 209, and a blocking film 211 such as a SiN film, etc., is formed on the lower copper wiring layer 210. The term blocking film is usually employed when the film serves as both an etching stopper film and as a barrier metal film.

Then, as shown in FIG. 19B, the insulating film 204 of the present embodiment is formed on the blocking film 211. As previously explained, the insulating film 204 is formed by the plasma CVD method using (1) a reaction gas containing a compound having the siloxane bond or (2) a reaction gas containing a $Si(OR)_n H_m$ compound. The conditions in this case are the same as those set forth in Table 1 to Table 4, which have already been described. The film thickness of the insulating film 204 can be controlled by changing the duration of film forming.

Then, as shown in FIG. 19C, a protection film 212 is formed on the insulating film 204. A dense and high quality silicon oxide film is used as the protection film 212. This protection film 212 serves to prevent the insulating film 204 from deteriorating in an ashing process and in an etching process.

In turn, as shown in FIG. 19D, photoresist 213 is coated on the protection film 212. After this, an opening 213a is formed in the photoresist 213 by photolithography. Then, the protection film 212 and the insulating film 204 are etched by the RIE (Reactive Ion Etching) while using the photoresist 213 as a mask. In this RIE, the plasmanized gas mixture containing: $CF_4+CHF_3$ or $C_4F_8$ may be used as the etching gas.

Then, the insulating film 204 located under the opening portion 213a in the photoresist 213 is removed by this etching, and an opening 204a is formed. A surface of the blocking film 211 is thereby exposed at the bottom of the opening 204a. Since the blocking film 211 has etching resistance against the gas mixture containing $CF_4+CHF_3$, the blocking film 211 is not etched by this RIE.

Then, as shown in FIG. 19E, the blocking film 211 is etched by the RIE while using the photoresist 213 as a mask. In this RIE, a gas mixture containing $CF_4+CHF_3$, in which the gas composition ratio is different than that used in etching the insulating film 204, is plasmanized. By use of this plasmanised gas mixture, an opening 211a is formed in the blocking film 211 located under the opening 213a, and a surface of the lower copper wiring layer 210 is thereby exposed. As a result, a via hole 214 reaching the lower copper wiring layer 210 is formed by this step.

Then, as shown in FIG. 19F, after the photoresist 213 is removed and a barrier metal layer (not shown), such as a TiN film, etc., is formed on a side wall of the via hole 214, a copper plating film 215 is formed on an inner surface of the via hole 214 and an upper surface of the protection film 212. This copper plating film 215 is formed by supplying a current to a copper seed layer (not shown), which is formed on the inner surface of the via hole 214 and the upper surface of the protection film 212 by means of a sputter method, etc.

After this step, the copper plating film 215 formed on the protection film 212 is removed by the CMP (Chemical Mechanical Polishing) method, and an upper copper wiring layer (not shown) is formed on the protection film 212.

According to the above-described damascene process, the insulating film 204 is formed as the interlayer insulating film between the lower copper wiring layer 210 and the upper copper wiring layer (not shown). This insulating film 204 is the low dielectric constant film that has the relative dielectric constant of about 2.7 at 1 MHz, as described above. Therefore, if the insulating film 204 is employed, the wiring capacitance between the lower copper wiring layer 210 and the upper copper wiring layer (not shown) can be reduced, and therefore a semiconductor device having a fast that operational speed can be provided.

EXAMPLES

The inventors examined how the properties of the insulating film 204 changed when the film forming conditions were changed, especially when using HMDS (chemical formula: $(Si(CH_3)_3)_2O$) as the compound having the siloxane bond. The results of the experimentation are explained in the following.

In these experiments, a 8-inch silicon wafer was employed as the substrate 103 (see FIG. 1). When the relative dielectric constant of the insulating film was measured, the C-V (Capacitance-Voltage) measuring method in which the high-frequency signal of 1 MHz was superposed on the DC bias was employed. When the refractive index of the film was measured, an ellipsometer using a He—Ne laser whose wavelength is 632.8 nm was employed.

(1) The case with an electrode distance of 25 mm

At first, a distance (electrode distance) between the upper electrode 104 and the lower electrode 102 was fixed at 25 mm, and the film forming conditions were changed as follows.

(i) The case where the pressure was changed

The film forming conditions in this case are given as the following Conditions A.

(Condition A)

HMDS flow rate: 50 sccm $N_2O$ flow rate: 200 sccm substrate temperature: 350° C.

deposited film thickness: 500 nm frequency of the high-frequency power applied by the first high-frequency power supply 107: 13.56 MHz power of the first high-frequency power supply 107: 300 W power of the second power supply 109: 0 W With the Conditions A, the high-frequency power was applied only to the upper electrode 104 and was not applied to the lower electrode 102.

When the pressure of the atmosphere was changed under the Conditions A, the relationship between the relative dielectric constant of the insulating film 204 and the pressure, and the relationship between the refractive index of the film and the pressure were obtained as in FIG. 5. In FIG. 5, an arrow pointing to the left indicates that the data series shown as dots ● represents the relative dielectric constant, and an arrow pointing to the right indicates that the data series shown as circles ○ represents the refractive index.

As can be seen from FIG. 5, when the high-frequency power was applied only to the upper electrode 104, the relative dielectric constant was almost constant at a value of about 2.8 even as the pressure of the atmosphere was changed. Similarly, the refractive index was almost constant at about 1.38 to 1.42.

The leakage current of the insulating film 204 formed under the Conditions A was of the order of $10^{-10}$ A/cm$^2$ at an electric field strength of 1 MV/cm over all pressures. This value is quite satisfactory for practical use.

Next, the inventors examined how the above tendency changed when the high-frequency power was applied, not only to the upper electrode 104, but also to the lower electrode 102. The film forming conditions in this case are given as the following Conditions B.

(Conditions B)

HMDS flow rate: 50 sccm

N$_2$O flow rate: 200 sccm substrate temperature: 350° C.

deposited film thickness: 500 nm frequency of the high-frequency power applied by the first high-frequency power supply 107: 13.56 MHz power of the first high-frequency power supply 107: 300 W frequency of the high-frequency power applied by the second high-frequency power supply 109: 380 KHz power of the second power supply 109: 30 W When the pressure of the atmosphere was changed under the Conditions B, the relationship between the relative dielectric constant of the insulating film 204 and the pressure, and the relationship between the refractive index of the film and the pressure were obtained as in FIG. 6.

As can be seen from FIG. 6, when the high-frequency power was applied to both the upper electrode 104 and the lower electrode 102, a tendency clearly different from that shown in FIG. 5 was obtained. That is, when the high-frequency power was applied to both electrodes, tendency was that, when the pressure was increased, the relative dielectric constant and the refractive index of the film were reduced.

In FIG. 6, the value of the relative dielectric constant at a pressure of 1.0 Torr was about 3.8. In the present example, the measurement was not carried out at a pressure lower than 1.0 Torr. However, it can be understood from FIG. 6 that the relative dielectric constant tends to become close to 4.0 at a pressure lower than 1.0 Torr.

In order to provide a semiconductor device in which the wiring capacitance is smaller than the prior art, a film whose relative dielectric constant is lower than that of SiO$_2$ film (4.1) must be employed as the interlayer insulating film. It can be understood from the above description that, to this end, the pressure should be set to more than 1.0 Torr and the high-frequency power should be applied to both the upper electrode 104 and the lower electrode 102.

Though the electrode distance was set to 25 mm in this example, the inventors similarly examined the case where the electrode distance was set to more than 50 mm. From this experiment, it became apparent that, when the electrode distance was set to more than 50 mm, the insulating film 204 having a relative dielectric constant lower than that of the SiO$_2$ film (4.1) could be formed by setting the pressure to more than 0.5 Torr.

The leakage current of the insulating film 204 formed under the Conditions B was on the order of $10^{-10}$ A/cm$^2$ at an electric field strength of 1 MV/cm over all pressures. This value is quite satisfactory for practical use.

(ii) The case where the power of the second high-frequency power supply 109 was changed As described above, it was found that, when the high-frequency power was applied not only to the upper electrode 104 but also to the lower electrode 102, the tendency was different from the case where the high-frequency power is applied only to one electrode.

Next, the inventors examined what change occurred in the properties of the insulating film 204 when the power of the high-frequency power applied to one electrode was changed while applying the high-frequency power to the other electrode.

The film forming conditions in this case were the Conditions C.

(Conditions C)

HMDS flow rate: 50 sccm

N$_2$O flow rate: 200 sccm substrate temperature: 350° C.

deposited film thickness: 500 nm frequency of the high-frequency power applied by the first high-frequency power supply 107: 13.56 MHz power of the first high-frequency power supply 107: 100 W frequency of the high-frequency power applied by the second high-frequency power supply 109: 380 KHz When the power of the second high-frequency power was changed under the Conditions C, the relationship between the power of the second high-frequency power supply 109 and dynamic hardness of the insulating film 204, and the relationship between the power of the second high-frequency power supply 109 and Young's modulus of the insulating film 204 were obtained as shown in FIG. 7. The measurement of the dynamic hardness and Young's modulus is carried out using an apparatus DUH-W201S made by Shimadzu Corporation.

As can be clearly seen from FIG. 7, the dynamic hardness and the Young's modulus of the film increases as the power of the second high-frequency power supply 109 increases. Put another way, when the power of the second high-frequency power supply 109 is larger than 0 W, a film is obtained having dynamic hardness and Young's modulus which are larger than obtained when the power is 0 W. This means that if the high-frequency power is applied not only to the upper electrode 104 but also to the lower electrode 102, film is obtained having dynamic hardness and Young's modulus larger than obtained when the power is applied only to the upper electrode 104.

In the damascene process for forming the copper wiring layer, the damascene trench is formed in the interlayer insulating film, and the copper plating is preformed for the upper surface of the interlayer insulating film and the inside of the damascene trench. After this, in order to leave the copper only in the damascene trench, the overall surface of the copper plating is polished by the CMP method. When polishing the surface by the CMP method, the interlayer insulating film, together with the copper plating thereon, is polished to some extent. If the interlayer insulating film is polished in this manner, the residual film thickness of the interlayer insulating film must be desirably controlled. In general, it has been known that in order to control the residual film thickness in the CMP, a film having a high dynamic hardness is preferable for the interlayer insulating film As described above, if the high-frequency power is applied to both the upper electrode 104 and the lower electrode 102, the film obtained has a dynamic hardness larger that obtained when the high-frequency power is applied only to the upper electrode 104. Accordingly, it is preferable to use the insulating film 204, formed by applying the high-frequency power to both the upper and lower electrode 104 and 102, as the insulating film which undergoes polishing in the CMP process.

The leakage current of the insulating film 204 formed under the Conditions C was on the order of $10^{-10}$ A/cm$^2$ at an electric field strength of 1 MV/cm over all pressures. This value is quite satisfactory for practical use.

(2) The case where the electrode distance is 50 mm

The results of the experiment of case (1) were obtained with an electrode distance fixed to 25 mm and the film forming conditions (except the electrode distance) changed. However, it is believed that the properties of the insulating film 204 may also change as the electrode distance changes. Therefore, the inventors examined how the properties of the insulating film 204 changed with change of the electrode distance. In particular, the experiment was carried out with the electrode distance fixed at to 50 mm in the following.

(i) The case where the high-frequency power is applied only to the upper electrode 104 and the power of the high-frequency power is changed The film forming conditions in this case are given as the following Conditions D.

(Conditions D)

HMDS flow rate: 50 sccm

N$_2$O flow rate: 200 sccm substrate temperature: 350° C.

deposited film thickness: 500 nm pressure: 0.9 Torr frequency of the high-frequency power applied by the first-high-frequency power supply 107: 13.56 MHz power of the second high-frequency power supply 109: 0 W As can be understood from the Conditions D, the high-frequency power was applied only to the upper electrode 104, and the high-frequency power was not applied to the lower electrode 102.

When the power of the first high-frequency power supply 107 was changed under the Conditions D, a relationship between the power of the first high-frequency power supply 107 and the relative dielectric constant of the insulating film 204, and a relationship between the power and the refractive index of the insulating film 204 were obtained as shown in FIG. 8.

As can be seen from FIG. 8, it can be understood that when the power of the high-frequency power was changed, the relative dielectric constant and the refractive index of the insulating film 204 were seldom changed. More specifically, the relative dielectric constant of the insulating film 204 is about 2.6 and the refractive index is about 1.38.

The leakage current of the insulating film 204 formed under the Conditions D was on the order of $10^{-10}$ A/cm$^2$ at an electric field strength of 1 MV/cm over all the power levels of the first high-frequency power supply 107. This value is quite satisfactory for practical use.

(ii) The case where the high-frequency power is applied to both the upper electrode 104 and the lower electrode 102, and the power of the high-frequency power applied to the lower electrode 102 is changed The film forming conditions in this case are given as following Conditions E.

(Conditions E)

HMDS flow rate: 50 sccm

N$_2$O flow rate: 200 sccm substrate temperature: 350° C.

deposited film thickness: 500 nm pressure: 0.9 Torr frequency of the high-frequency power applied by the first high-frequency power supply 107: 13.56 MHz power of the first high-frequency power supply 107: 300 W frequency of the high-frequency power applied by the second high-frequency power supply 109: 380 KHz When the power of the second high-frequency power supply 109 was changed under the Conditions E, a relationship between the power of the second high-frequency power supply 109 and the relative dielectric constant of the insulating film 204, and a relationship between the power and the refractive index of the insulating film 204 were obtained as shown in FIG. 9.

As can be seen from FIG. 9, if the power of the second high-frequency power supply 109 is increased, the relative dielectric constant and the refractive index of the film are increased correspondingly. However, it can also be understood from FIG. 9 that the relative dielectric constant and the refractive index have their maximum values when the power of the second high-frequency power supply 109 is around 100 W, and they are reduced when the power is larger than 100 W. Also, it can be seen from FIG. 9 that the relative dielectric constant does not exceed a maximum value of 4.0. Accordingly, even if the high-frequency power is applied to the upper electrode 104 and the lower electrode 102, the relative dielectric constant of the insulating film 204 does not exceed the relative dielectric constant (4.1) of the conventional SiO$_2$ film.

Here, in order to see how the relative dielectric constant of the insulating film 204 changed when the electrode distance was changed, FIG. 5 and FIG. 9 are compared in the following. Particularly, in order to avoid disparity in the conditions other than the electrode distance, the relative dielectric constant (about 2.9) obtained when the pressure is 1.0 Torr in FIG. 5 should be compared with the relative dielectric constant (about 2.6) obtained when the power of the second high-frequency power supply 109 is 0 W in FIG. 9. These values were obtained respectively when the film forming conditions other than the electrode distance were set substantially equal. More specifically, these values were obtained when only the power of the first high-frequency power supply 107, which was 300 W, was applied and the pressure was about 1.0 Torr.

As can be clearly seen by comparing these values, the dielectric constant obtained when the electrode distance was set to 50 mm was lower than that obtained when the electrode distance was set to 25 mm. The reason for this is as follows. That is, if the electrode distance is large, the area (sheath area) where the gradient of the potential appears between the electrodes is relatively reduced compared with the case where the electrode distance is narrow. If the sheath area is reduced in this manner, the acceleration of the methyl groups caused by this sheath area can be suppressed and decomposition of the methyl groups can also be suppressed. Therefore, the methyl groups can be taken into the insulating film 204 in their complete form, and therefore the dielectric constant of the insulating film 204 is lowered.

Therefore, in order to lower the dielectric constant of the insulating film 204, it is preferable to expand the electrode distance. More specifically, it is preferable to set the electrode distance at more than 25 mm.

The leakage current of the insulating film 204 formed under the Conditions E was on the order of $10^{-10}$ A/cm$^2$ at an electric field strength of 1 MV/cm at all power levels of the second high-frequency power supply 109. This value is quite satisfactory for practical use.

(3) The case where $H_2O$ is employed as an oxidizing gas

The above results of experimentation were obtained by employing $N_2O$ as the oxidizing gas. The inventors examined how the property of the insulating film 204 changed when the film forming conditions were changed when using $H_2O$ as the oxidizing gas in place of $N_2O$.

(i) The case where the high-frequency power is applied only to the lower electrode 102 and the pressure is changed The film forming conditions in this case are given as the following Conditions F.

(Conditions F)
HMDS flow rate: 50 sccm
$H_2O$ flow rate: 100 sccm
substrate temperature: 200° C.
deposited film thickness: 500 nm
electrode distance: 25 mm
power of the first high-frequency power supply 107: 0 W
frequency of the high-frequency power applied by the second high-frequency power supply 109: 380 KHz
power of the second high-frequency power supply 109: 100 W As can be understood from the Conditions F, the high-frequency power was applied only to the lower electrode 102 and was not applied to the upper electrode 104.

When the pressure was changed under the Conditions F, a relationship between the relative dielectric constant of the insulating film 204 and the pressure, and a relationship between the refractive index and the pressure were obtained as shown in FIG. 10.

As can be seen from FIG. 10, it can be understood that the relative dielectric constant and the refractive index of the insulating film 204 are reduced as the pressure of the atmosphere is increased. It can also be understood that the relative dielectric constant of the insulating film 204 is lower than that of the conventional SiO$_2$ film (4.1) at all pressures.

The leakage current of the insulating film 204 formed under the Conditions F was on the order of $10^{-10}$ A/cm$^2$ at an electric field strength of 1 MV/cm at all pressures. This value is quite satisfactory for practical use.

(ii) Examination of amounts of $H_2O$ contained in the film

If $H_2O$ is used as the oxidizing gas as above, there is the possibility that $H_2O$ will be contained in the insulating film 204. The inventors therefore examined how the $H_2O$ contained in the insulating film 204 changed when the pressure was changed under the Conditions F.

The results of this examination are shown in FIG. 11. FIG. 11 shows the results as measured by Infrared Absorption Spectroscopy.

If $H_2O$ is contained in the film, a peak appears in vicinity of the wavelength of 3600 cm$^{-1}$. However, as can be seen from FIG. 11, no peak appears in vicinity of 3600 cm$^{-1}$ at all pressures. This means that, regardless of the pressure of the atmosphere, no $H_2O$ is contained in the insulating film 204 that is formed in accordance with the Conditions F.

In general, if $H_2O$ is contained in the interlayer insulating film, $H_2O$ diffuses into the underlying wiring layer formed under the interlayer insulating film, and the wiring layer corrodes due to the diffusion of the $H_2O$. As described above, in the present embodiment, even if $H_2O$ is used as the oxidizing gas, no $H_2O$ is contained in the insulating film 204, and thus such problem does not arise.

In addition, according to the results of another experiment by the inventors, such a good result was obtained that the film thickness of the insulating film 204 varied less than 3%.

(iii) The case where the high-frequency power is applied also to the upper electrode 104, and the power of the high-frequency power applied to the lower electrode 102 is changed In the Conditions F, the high-frequency power is applied only to the lower electrode 102. The inventors examined how the properties of the insulating film 204 changed when the high-frequency power was applied also to the upper electrode 104 and the power of the high-frequency power applied to the lower electrode 102 was changed.

The film forming conditions in this case are given as following Conditions G.

(Conditions G)
HMDS flow rate: 50 sccm
$H_2O$ flow rate: 250 sccm
substrate temperature: 375° C.
deposited film thickness: 500 nm
electrode distance: 25 mm
pressure: 2.3 Torr
frequency of the high-frequency power applied by the first high-frequency power supply 107: 13.56 MHz
power of the first high-frequency power supply 107: 300 W
frequency of the high-frequency power applied by the second high-frequency power supply 109: 380 KHz When the relative dielectric constant and the refractive index of the resultant insulating film 204 were examined while changing the power of the high-frequency power applied by the second high-frequency power supply 109 under Conditions G, the results shown in FIG. 12 were obtained.

As shown in FIG. 12, it can be understood that as the power of the second high-frequency power supply 109 is reduced, the relative dielectric constant and the refractive index of the insulating film 204 are lowered.

Next, the inventors examined the leakage current of the insulating film 204 formed under the Conditions G by changing the power of the second high-frequency power supply 109 as in the above.

In this experiment, as shown in FIG. 13, the insulating film 204 was formed on a p-type silicon substrate 207 under the Conditions G. Then, with the p-type silicon substrate 207 being grounded, a mercury probe 208 having an electrode area of 0.02258 cm$^2$, was brought into contact with the upper surface of the insulating film 204, and a negative potential was given to the mercury probe 208.

Results of the experiment are shown in FIG. 14. In FIG. 14, the ordinate represents the leakage current (A/cm$^2$) of the insulating film 204 in a logarithmic scale. On the other hand, the abscissa represents the strength of the electric field (MV/cm) applied to the insulating film 204, and a (−) sign indicates that a negative potential was applied to the mercury probe 208.

As shown in FIG. 14, the leakage current was $10^{-10}$ to $10^{-9}$ A/cm$^2$ at –1 MV/cm, and this value is quite satisfactory for practical use.

(iv) Examination of NH$_3$ contained in the film

It is preferable that, when the insulating film 204 is used as the interlayer insulating film and chemical amplification resist is coated on the insulating film 204 for pattering, NH$_3$ not be contained in the insulating film 204. This is because, if NH$_3$ is contained in the insulating film 204, the chemical amplification resist formed on the insulating film 204 is crosslinked by the NH$_3$ when the resist undergoes patterning, and thus the desired resist pattern cannot be formed. Especially, in a case where a fine pattern is required for the resist, this phenomenon becomes prominent, which poses a barrier to fine patterning for the underlying insulating film.

When the nitrogen oxide (N$_2$O, etc.), which serves as the oxidizing gas, is added into the reaction gas, NH$_3$ is apt to be contained in the film because of N (nitrogen) in the nitrogen oxide. In order to verify this phenomenon, the inventors formed an insulating film by using Si(CH$_3$)$_4$ and N$_2$O, and then examined the amount of NH$_3$ in the insulating film. The film forming conditions for this insulating film are given as following Conditions H.

(Conditions H)

Si(CH$_3$)$_4$ flow rate: 80 sccm

N$_2$O flow rate: 320 sccm substrate temperature: 350° C.

deposited film thickness: 500 nm pressure: 1 Torr frequency of the high-frequency power applied by the first high-frequency power supply 107: 13.56 MHz power of the first high-frequency power supply 107: 300 W frequency of the high-frequency power applied by the second high-frequency power supply 109: 400 KHz power of the second high-frequency power supply 109: 30 W The amounts of NH$_3$ contained in the insulating film formed under the Conditions H are shown in FIG. 15. FIG. 15 is graph showing the amounts of NH$_3$ measured by the TDS (Thermal Desorption Spectroscopy) method. The abscissa of this graph represents the temperature (° C.) at which the insulating film is heated in the measurement. On the other hand, the ordinate represents the relative ion intensity (%) of a monovalent positive ion whose molecular weight is 17. Here, the relative ion intensity (%) is defined as (ion intensity of the monovalent positive ion whose molecular weight is 17)/(total ion intensity desorped by heating). NH$_3$ is ionized to NH$_3^+$ by the heating and since the NH$_3^+$ is monovalent positive ion whose molecular weight is 17, what is depicted in the FIG. 15 is the relative ion intensity of the NH$_3^+$.

As can be seen from FIG. 15, when the power of the second high-frequency power supply 109 is applied to the lower electrode 102 under the conditions H, NH$_3^+$ is desorbed at a temperature of about 250° C. It can also be understood that when the power of the second high-frequency power supply 109 is not applied to the lower electrode 102, NH$_3^+$ is desorbed at a temperature of about 400° C.

In this manner, it can be understood that if nitrogen oxide (N$_2$O, etc.) is used as the oxidizing gas, NH$_3$ is contained in the film regardless whether the bias is applied or not.

On the contrary, when H$_2$O is used as the oxidizing gas, NH$_3$ is not contained in the film. In order to verify this, the inventors examined the amount of NH$_3$ contained in the insulating film 204 that is formed under the following Conditions I.

(Conditions I)

HMDS flow rate: 50 sccm

H$_2$O flow rate: 250 sccm substrate temperature: 375° C.

deposited film thickness: 500 nm electrode distance: 25 mm frequency of the high-frequency power applied by the first high-frequency power supply 107: 13.56 MHz power of the first high-frequency power supply 107: 300 W power of the second high-frequency power supply 109: 0 W As can be seen from the Conditions I, the high-frequency power is applied only to the upper electrode 104 and is not applied to the lower electrode 102. That is, bias is not applied in the Conditions I.

With the pressure in film-forming the film varied under the Conditions I, the amount of NH$_3$ contained in the insulating film 204 was measured as shown in FIG. 16. FIG. 16 is a graph showing the results obtained when the amount of NH$_3$ contained in the insulating film was measured by the TDS method. Since the abscissa and the ordinate of this graph are the same as those explained previously in connection with FIG. 15, their explanation will be omitted here.

Although the desorption begins at a temperature of 600° C. in FIG. 16, this is not due to NH$_3^+$, but due to the isotope of CH$_4^+$ whose molecular weight is 17. In this manner, if H$_2$O is used as the oxidizing gas, the amount of NH$_3$ contained in the film can be largely reduced compared with the case where N$_2$O is used as the oxidizing gas. Therefore, if the insulating film 204 is formed by using H$_2$O as the oxidizing gas and the chemical amplification resist is formed thereon, the chemical amplification resist can be patterned with the desired precision. This will be explained with reference to FIGS. 20A to 20G, in which the damascene process is exemplified. FIGS. 20A to 20G are sectional views showing respective sectional shapes when the damascene process is applied to the insulating film 204 formed by using H$_2$O as the oxidizing gas.

First, as shown in FIG. 20A, a lower copper wiring layer 210 is formed on an underlying interlayer insulating film 209 and then a blocking film 211 such as an SiN film, etc. is formed thereon.

Then, as shown in FIG. 20B, the insulating film 204 is formed on the blocking film 211 under the Conditions I. In this manner, as described above, the amount of NH$_3$ contained in the insulating film 204 is sufficiently reduced.

Then, as shown in FIG. 20C, chemical amplification resist 216 is coated on the insulating film 204.

Then, as shown in FIG. 20D, an opening 216a is formed by patterning the chemical amplification resist 216 by use of photolithography. As described above, since the amount of NH$_3$ contained in the insulating film 204 has been sufficiently reduced, the chemical amplification resist 216 is not crosslinked by NH$_3$ during this patterning. Therefore, a fine pattern of the chemical amplification resist 216 can be obtained in this step, and thus the diameter of the opening portion 216a can be made desirably small.

Then, as shown in FIG. 20E, using the chemical amplification resist 216 as an etching mask, an opening 204a is formed by etching the insulating film 204.

This etching is carried out by RIE, in which a gas mixture containing CF$_4$+CHF$_3$ or C$_4$F$_8$ is used as the etching gas.

Since the pattern of the chemical amplification resist 216 is finely formed as described above, the pattern of the insulating film 204 can also be finely formed. Thus, the opening 204a with a small diameter can be formed in the insulating film 204. In this etching, the blocking film 211 has etching resistance against the gas mixture containing $CF_4+CHF_3$, which is used as etching gas. Therefore, the blocking film 211 is not etched.

Then, as shown in FIG. 20F, using the chemical amplification resist 216 as a etching mask, the blocking film 211 is etched by RIE. In this RIE, a gas mixture containing $CF_4+CHF_3$, in which the gas composition ratio is different from that used in etching the insulating film 204, is plasmanized. By use of this plasmanised gas mixture, an opening 211a is formed in the blocking film 211 located under the opening 216a, and a surface of the lower copper wiring layer 210 is thereby exposed. As a result, a via hole 214 reaching the lower copper wiring layer 210 is formed.

Then, as shown in FIG. 20G, after the chemical amplification resist 216 is removed, a barrier metal layer (not shown), such as TiN film, etc., is formed on a side wall of the via hole 214, and then a copper plating film 215 is formed in the inside of the via hole 214 and on the insulating film 204. This copper plating film 215 is formed by supplying a current to a copper seed layer (not shown), which is formed on the inner surface of the via hole 214 and the upper surface of the insulating film 204 by means of a sputter method, etc.

After this step, the copper plating film 215 formed on the insulating film 204 is removed by the CMP (Chemical Mechanical Polishing) method, and then an upper copper wiring layer (not shown) is formed on the insulating film 204.

As described above, if the insulating film 204 is formed by using a reaction gas containing HMDS and $H_2O$, and then the chemical amplification resist 216 is formed thereon, the chemical amplification resist 216 is not crosslinked by $NH_3$. Therefore, since the chemical amplification resist 216 can be finely patterned, the insulating film 204 can be finely etched using the chemical amplification resist 216 as an etching mask.

In this fashion, if the insulating film 204 is formed by using a reaction gas containing HMDS and $H_2O$, not only can the dielectric constant of the film 204 be lowered, but also the amount of $NH_3$ in the film 204 can be reduced and therefore a fine pattern can easily be made in the film 204.

Next, the inventors examined the relative dielectric constant and the refractive index of the insulating film 204 obtained when the pressure of the atmosphere was changed under the Conditions I. The results are shown in FIG. 17.

As shown in FIG. 17, as the pressure is increased, both the relative dielectric constant and the refractive index are lowered.

In addition, the inventors examined the leakage current in the insulating film 204 formed under the same conditions as FIG. 17. Since the leakage current measuring method is the same as that explained with reference to FIG. 13, its explanation will be omitted here.

The results are shown in FIG. 18. As shown in FIG. 18, the leakage current is $10^{-10}$ to $10^{-9}$ $A/cm^2$ at $-1$ MV/cm, and this value is quite satisfactory for practical use.

As described above, according to the film forming method of the present invention, an insulating film containing silicon is formed by using a compound having a siloxane bond or the $Si(OR)_nH_m$ compound. Alkoxy or alkyl groups are contained in the insulating film, and the dielectric constant of the portions of the film in which The alkoxy or alkyl groups are contained is lowered, and thus the dielectric constant of the entire film is lowered.

Also, in the compound having the siloxane bond or the $Si(OR)_nH_m$ compound, Si and O are already bonded. Therefore, when the insulating film containing silicon is formed by using these compounds, Si—C bonds are hardly formed in the film. Therefore, the increase in the leakage current due to the Si—C bond can be reduced in the insulating film containing silicon formed as above.

Especially, when a parallel plate type plasma chemical vapor deposition apparatus is used for film forming, and also the gas containing HMDS (chemical formula: $(Si(CH_3)_3)_2O)$) and $N_2O$ is used as the reaction gas, the following particular advantages can be achieved if the film is formed under the following conditions.

(1) Applying high-frequency power to both the upper and lower electrodes.

In this manner, an insulating film containing silicon is formed having a larger dynamic hardness than that formed where the high-frequency power is applied only to the upper electrode.

(2) Applying the high-frequency power to both the upper and lower electrodes, and setting the pressure of the atmosphere to more than 0.5 Torr.

Under these conditions, the insulating film containing silicone is formed having a larger dynamic hardness than that formed with the high-frequency power applied only to the upper electrode and having a lower dielectric constant than that of the $SiO_2$ film.

(3) Applying the high-frequency power only to the upper electrode, and setting the electrode distance to more than 25 mm.

Under these conditions, an insulating film containing silicon is formed having a lower dielectric constant than that formed with the high-frequency power applied only to the upper electrode and the distance between the upper and lower electrodes less than 25 mm.

Also, if a reaction gas containing HMDS and $H_2O$ is used, $NH_3$ is seldom contained in the resultant insulating film containing silicon. Therefore, the chemical amplification resist formed on the insulating film containing silicon is not crosslinked by $NH_3$. As a result, the resist can be finely patterned and thus the insulating film containing silicon can be finely patterned.

The invention is not to be constructed as limited to the particular examples describes herein, as these are to be regarded as illustrative, rather than restrictive. The invention is intended to cover all processes and structures which do not depart from the spirit and scope of the invention. For example, though in the examples HMDS is utilized, other compounds having siloxane bonds such as OMCTS, HEDS, TMDS, TEDS, TMCTS, TETCS may be utilizing as alternatives.

What is claimed is:

1. A film forming method for forming an insulating film containing silicon on a substrate comprising converting a mixture of a gas of a compound having siloxane bonds and an oxidizing gas to a plasma and contacting the substrate with the plasma, whereby the gases react with each other to form the insulating film on the substrate, said insulating film having a dielectric constant which is lower than that of a silicon oxide film.

2. A film forming method according to claim 1, wherein the compound having the siloxane bonds is selected from the group consisting of $(Si(CH_3)_3)_2O$, $(Si(CH_3)_2)_4O_4$, $(Si(C_2H_5)_3)_2O$, $(SiH(CH_3)_2)_2O$, $(SiH(C_2H_5)_2)_2O$, $(SiH(CH_3))_4O_4$, and $(SiH(C_2H_5))_4O_4$.

3. A film forming method according to claim 2, wherein the oxidizing gas contains at least one gas selected from the group consisting of $N_2O$, $O_2$, $H_2O$, and $CO_2$.

4. A film forming method according to claim 3, wherein an inert gas is further added to said mixture which is converted to the plasma.

5. A film forming method according to claim 1, wherein the converting to a plasma is performed by applying a high-frequency power to the mixture.

6. A film forming method according to claim 5, wherein the high-frequency power is applied intermittently to the mixture.

7. A film forming method using a parallel plate type plasma chemical vapor deposition apparatus in which an upper electrode and a lower electrode are provided opposing each other in a chamber, said method comprising:

introducing a reaction gas containing $(Si(CH_3)_3)_2O$ and $N_2O$ into the chamber with a substrate therein; and applying high-frequency power to the electrodes to convert the reaction gas to a plasma, said plasma forming an insulating film containing silicon on the substrate, said insulating film having a dielectric constant which is lower than that of a silicon oxide film.

8. A film forming method according to claim 7, wherein pressure within the chamber is more than 0.5 Torr.

9. A film forming method using a parallel plate type plasma chemical vapor deposition apparatus in which an upper electrode and a lower electrode are provided opposing each other in a chamber and spaced apart more than 25 mm, said method comprising:

introducing a reaction gas containing $(Si(CH_3)_3)_2O$ and $N_2O$ into the chamber with a substrate therein; and applying high-frequency power to only the upper electrode to convert the reaction gas to a plasma, said plasma forming an insulating film containing silicon on the substrate, said insulating film having a dielectric constant which is lower than that of a silicon oxide film.

10. A film forming method for forming an insulating film containing silicon on a substrate comprising converting a gaseous admixture of a gas of a $Si(OR)_nH_m$ compound (where R is an alkyl group, n and m denote integers satisfying n+m=4 and $m \geq 0$) and an oxidizing gas to a plasma and contacting the substrate with the plasma, whereby the gases react with each other to form the insulating film on the substrate.

11. A film forming method according to claim 10, wherein the $Si(OR)_nH_m$ compound is selected from the group consisting of $Si(OCH_3)_3H$, $Si(OC_2H_5)_3H$, $Si(OCH_3)_4$, and $Si(OC_2H_5)_4$.

12. A film forming method according to claim 11, wherein the oxidizing gas contains at least one compound selected from the group consisting of $N_2O$, $O_2$, $H_2O$, and $CO_2$.

13. A film forming method according to claim 10, wherein a $C_pH_q$ compound is further added to the gaseous admixture which is converted to the plasma.

14. A film forming method according to claim 13, wherein the $C_pH_q$ compound is selected from the group consisting of $CH_4$, $C_2H_4$, and $C_2H_6$.

15. A film forming method according to claim 14, wherein an inert gas is further added to the gaseous admixture which is converted to the plasma.

16. A film forming method according to claim 1, wherein a gas containing at least one of $O_2$, $N_2O$, and $NH_3$ is converted to a second plasma and, after the insulating film containing silicon is formed, a surface of the insulating film containing silicon is exposed to the second plasma.

17. A film forming method according to claim 1, wherein an underlying insulating film is formed on the substrate and the insulating film containing silicon is formed on the underlying insulating film.

18. A film forming method according to claim 1, wherein a cover insulating film is formed over the insulating film containing silicon.

19. A semiconductor device comprising the insulating film containing silicon formed by employing the film forming method set forth in claim 1.

20. A film forming method according to claim 10 wherein said oxidizing gas is $N_2O$.

* * * * *

UNITED STATES PATENT AND TRADEMARK OFFICE
CERTIFICATE OF CORRECTION

PATENT NO. : 6,642,157 B2
DATED : November 4, 2003
INVENTOR(S) : Yoshimi Shioya et al.

It is certified that error appears in the above-identified patent and that said Letters Patent is hereby corrected as shown below:

Column 8,
Line 65, change "(200°)" to -- (20°) --.

Signed and Sealed this

Twenty-fourth Day of January, 2006

JON W. DUDAS
*Director of the United States Patent and Trademark Office*